United States Patent
Yu et al.

(10) Patent No.: US 11,591,894 B2
(45) Date of Patent: Feb. 28, 2023

(54) FIELD OPERATIONS SYSTEM WITH PARTICLE FILTER

(71) Applicant: Schlumberger Technology Corporation, Sugar Land, TX (US)

(72) Inventors: Yingwei Yu, Katy, TX (US); Qiuhua Liu, Sugar Land, TX (US); Richard Meehan, Houston, TX (US); Sylvain Chambon, Katy, TX (US); Mohammad Hamzah, Katy, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1048 days.

(21) Appl. No.: 16/192,609

(22) Filed: Nov. 15, 2018

(65) Prior Publication Data

US 2019/0145239 A1  May 16, 2019

Related U.S. Application Data

(60) Provisional application No. 62/586,288, filed on Nov. 15, 2017.

(51) Int. Cl.
*G06N 7/00* (2006.01)
*E21B 44/00* (2006.01)
(Continued)

(52) U.S. Cl.
CPC .............. *E21B 44/00* (2013.01); *E21B 21/08* (2013.01); *E21B 49/003* (2013.01); *G01V 1/50* (2013.01);
(Continued)

(58) Field of Classification Search
CPC ........ E21B 44/00; E21B 21/08; E21B 49/003; G01V 1/50; G01V 11/00; G01V 2200/14;
(Continued)

(56) References Cited

U.S. PATENT DOCUMENTS 6,286,104 B1  9/2001  Buhle et al.
6,526,167 B1  2/2003  Numaoka
(Continued)

FOREIGN PATENT DOCUMENTS

CN   103606006 A   2/2014
CN   106919977 A   7/2017
(Continued)

OTHER PUBLICATIONS

International Search Report and Written Opinion for the cross referenced International patent application PCT/US2018/061314 dated Feb. 1, 2019.
(Continued)

*Primary Examiner* — Fernando Alcon
(74) *Attorney, Agent, or Firm* — Alec J. McGinn

(57) ABSTRACT

A method can include receiving channels of data from equipment responsive to operation of the equipment in an environment where the equipment and environment form a dynamic system; defining a particle filter that localizes a time window with respect to the channels of data; applying the particle filter at least in part by weighting particles of the particle filter using the channels of data, where each of the particles represents a corresponding time window; and selecting one of the particles according to its weight as being the time window of an operational state of the dynamic system.

17 Claims, 17 Drawing Sheets

(51) Int. Cl.
| | |
|---|---|
| *E21B 21/08* | (2006.01) |
| *G01V 1/50* | (2006.01) |
| *E21B 49/00* | (2006.01) |
| *G01V 11/00* | (2006.01) |
| *G06F 30/20* | (2020.01) |
| *G06N 3/04* | (2006.01) |
| *G06F 30/27* | (2020.01) |
| *G06N 3/08* | (2006.01) |
| *G06F 17/15* | (2006.01) |
| *G06F 17/16* | (2006.01) |
| *G06T 13/80* | (2011.01) |

(52) U.S. Cl.
CPC .............. *G01V 11/00* (2013.01); *G06F 17/15* (2013.01); *G06F 17/16* (2013.01); *G06F 30/20* (2020.01); *G06F 30/27* (2020.01); *G06N 3/0445* (2013.01); *G06N 3/0472* (2013.01); *G06N 3/08* (2013.01); *G06N 7/00* (2013.01); *G01V 2200/14* (2013.01); *G01V 2200/16* (2013.01); *G06T 13/80* (2013.01)

(58) Field of Classification Search
CPC ..... G01V 2200/16; G06F 17/15; G06F 17/16; G06F 30/20; G06F 30/27; G06N 3/0445; G06N 3/0472; G06N 3/08; G06N 7/00; G06N 3/0454; G06N 7/005; G06T 13/80
See application file for complete search history.

(56) References Cited

U.S. PATENT DOCUMENTS

| | | | |
|---|---|---|---|
| 7,128,167 | B2 | 10/2006 | Dunlop et al. |
| 7,321,882 | B2* | 1/2008 | Jaeger ...................... G06N 3/08 706/30 |
| 8,504,361 | B2 | 8/2013 | Collobert et al. |
| 10,066,473 | B2 | 9/2018 | Khare |
| 10,400,573 | B2 | 9/2019 | Yang et al. |
| 11,474,486 | B2* | 10/2022 | Berntorp ................ G06N 7/005 |
| 2004/0117043 | A1* | 6/2004 | Touzov .................. G05B 17/02 700/53 |
| 2004/0124009 | A1 | 7/2004 | Hoteit et al. |
| 2004/0124012 | A1 | 7/2004 | Dunlop et al. |
| 2004/0223480 | A1* | 11/2004 | Nguyen .............. H04L 25/0236 370/342 |
| 2004/0256152 | A1 | 12/2004 | Dashevskiy et al. |
| 2006/0047607 | A1* | 3/2006 | Boyden ................ G05B 13/048 705/400 |
| 2006/0221081 | A1 | 10/2006 | Cohen et al. |
| 2007/0022068 | A1 | 1/2007 | Linsker |
| 2007/0118346 | A1 | 5/2007 | Wen et al. |
| 2007/0185696 | A1 | 8/2007 | Moran et al. |
| 2010/0302129 | A1 | 12/2010 | Kastrup |
| 2012/0123757 | A1 | 5/2012 | Ertas et al. |
| 2013/0013543 | A1 | 1/2013 | Dull et al. |
| 2013/0282635 | A1 | 10/2013 | Dull et al. |
| 2015/0308204 | A1 | 10/2015 | Johnson et al. |
| 2016/0099010 | A1 | 4/2016 | Sainath et al. |
| 2016/0231716 | A1 | 8/2016 | Johnson et al. |
| 2018/0052078 | A1 | 2/2018 | Newberger |
| 2018/0188403 | A1 | 7/2018 | Halsey et al. |
| 2019/0034558 | A1 | 1/2019 | Leeman-Munk et al. |
| 2019/0065961 | A1 | 2/2019 | Szu |
| 2019/0147125 | A1 | 5/2019 | Yu et al. |
| 2020/0104437 | A1* | 4/2020 | Yu ........................ G01M 5/0083 |
| 2021/0148213 | A1 | 5/2021 | Madasu et al. |
| 2021/0166115 | A1 | 6/2021 | Yu |
| 2022/0013239 | A1* | 1/2022 | Iwamori .................. G06N 3/08 |
| 2022/0187253 | A1* | 6/2022 | Takamine ............ G01N 29/045 |

FOREIGN PATENT DOCUMENTS

| | | |
|---|---|---|
| CN | 108363361 A | 8/2018 |
| JP | 2011123187 | 8/2011 |

OTHER PUBLICATIONS

Stubberud S. C. et al., "System identification using the neural-extended Kalman filter for state-estimation and controller modification", Neural networks, 2008, pp. 1352-1357.
De Lima, D. P. et al., "neural Network Training Using Unscented and Extended Kalman Filter", Robotics Automation Engineering Journal, 2017, 1(4), 6 pages.
Yu, Y. et al., "Using Deep Kalman Filter to Predict Drilling Time Series", IPTC-19207-MS, 2019, pp. 1-11.
Del Moral, "Nonlinear Filtering: Interacting Particle Solution," Markov Processes and Related Fields. 2 (4), 1996, pp. 555-580.
Deng, et al., "ImageNet: A large-scale hierarchical image database," In Proc. CVPR, 2009.
Gers, et al., "Learning to Forget: Continual Prediction with LSTM," Journal of Neural Computation, vol. 12, Issue 10, Oct. 2000, pp. 2451-2471.
Goodfellow, et al., "Deep Learning," MIT Press book, 2016.
Hochreiter, et al., "Long Short-Term Memory," Neural Computation 9(8), pp. 1735-1780, 1997.
Krishnan, et al., "Deep Kalman Filters," submitted on Nov. 16, 2015, Courant Institute of Mathematical Sciences, New York University, retrieved at https://arxiv.org/abs/1511.05121.
Pearson, "On Lines and Planes of Closest Fit to Systems of Points in Space," Philosophical Magazine 2: 1901, pp. 559-572.
Rosenblatt, "Principles of neurodynamics: Perceptrons and the Theory of Brain Mechanisms," Spartan Books, Washington DC, 1961.
Shashua et al., "Deep Robust Kalman Filter", submitted on Mar. 7, 2017, retrieved at https://arxiv.org/pdf/1703.02310.pdf.
Silver, et al, "Mastering the Game of Go with Deep Neural Networks and Tree Search," Nature, vol. 529, Jan. 28, 2016, pp. 484-489.
Simonyan, et al., "Very Deep Convolutional Networks for Large-Scale Image Recognition," Conference paper at International Conference on Learning Representations 2015.
Thrun, "Particle Filters in Robotics," UAI 2002 Proceedings of the Eighteenth conference on Uncertainty in artificial intelligence, 2002, pp. 511-518.
Van den Oord, "WaveNet: A Generative Model For Raw Audio," introduced at WaveNet, a deep neural network for generating raw audio waveforms, 2016.
Yu, et al., "Recorded Well Data Enriches the Testing of Automation Systems by Using a Deep Neural Network Approach," IADC/SPE-189591-MS, IADC/SPE Drilling Conference and Exhibition held in Fort Worth, TX, Mar. 6-8, 2018.
Haugen, et al. "History Matching Using the Ensemble Kalman Filter on a North Sea Field Case", Society of Petroleum Engineers, 2008, pp. 382-291.
Simon, "Using Nonlinear Kalman Filtering to Estimate Signals", 2013, pp. 1-16.
Genc, S. "Parametric System Identification Using Deep Convolutional Neural Networks", IEEE, 2017, pp. 2112-2119.

* cited by examiner

Example of Neural Network Model of Deep Kalman Filter
1200

$$X_{t+1} \leftarrow f(X_t) + b(U_{t-w:t})$$

$$Z_{t+1} \leftarrow h(X_{t+1})$$

FIELD OPERATIONS SYSTEM WITH PARTICLE FILTER

RELATED APPLICATIONS

This application claims priority to and the benefit of a US Provisional Application having Ser. No. 62/586,288, filed 15 Nov. 2017, which is incorporated by reference herein, and this application incorporates by reference herein U.S. Non-Provisional application having Ser. No. 16/192584, filed 15 Nov. 2018, entitled "Field Operations System", and incorporates by reference herein U.S. Non-Provisional application having Ser. No. 16/636,317, filed 15 Nov. 2018, entitled "Field Operations System with Filter".

BACKGROUND

A resource field can be an accumulation, pool or group of pools of one or more resources (e.g., oil, gas, oil and gas) in a subsurface environment. A resource field can include at least one reservoir. A reservoir may be shaped in a manner that can trap hydrocarbons and may be covered by an impermeable or sealing rock. A bore can be drilled into an environment where the bore may be utilized to form a well that can be utilized in producing hydrocarbons from a reservoir.

A rig can be a system of components that can be operated to form a bore in an environment, to transport equipment into and out of a bore in an environment, etc. As an example, a rig can include a system that can be used to drill a bore and to acquire information about an environment, about drilling, etc. A resource field may be an onshore field, an offshore field or an on- and offshore field. A rig can include components for performing operations onshore and/or offshore. A rig may be, for example, vessel-based, offshore platform-based, onshore, etc.

Field planning can occur over one or more phases, which can include an exploration phase that aims to identify and assess an environment (e.g., a prospect, a play, etc.), which may include drilling of one or more bores (e.g., one or more exploratory wells, etc.). Other phases can include appraisal, development and production phases.

SUMMARY

A method can include receiving channels of data from equipment responsive to operation of the equipment in an environment where the equipment and environment form a dynamic system; defining a particle filter that localizes a time window with respect to the channels of data; applying the particle filter at least in part by weighting particles of the particle filter using the channels of data, where each of the particles represents a corresponding time window; and selecting one of the particles according to its weight as being the time window of an operational state of the dynamic system.

Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
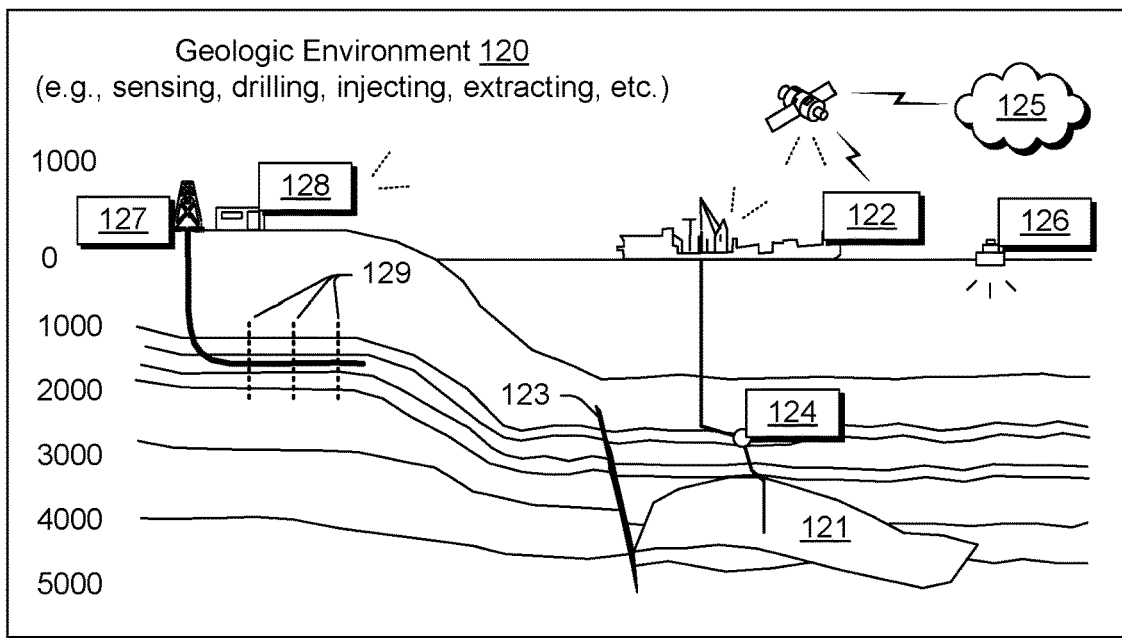
FIG. 1 illustrates examples of equipment in a geologic environment.
Figure 1:
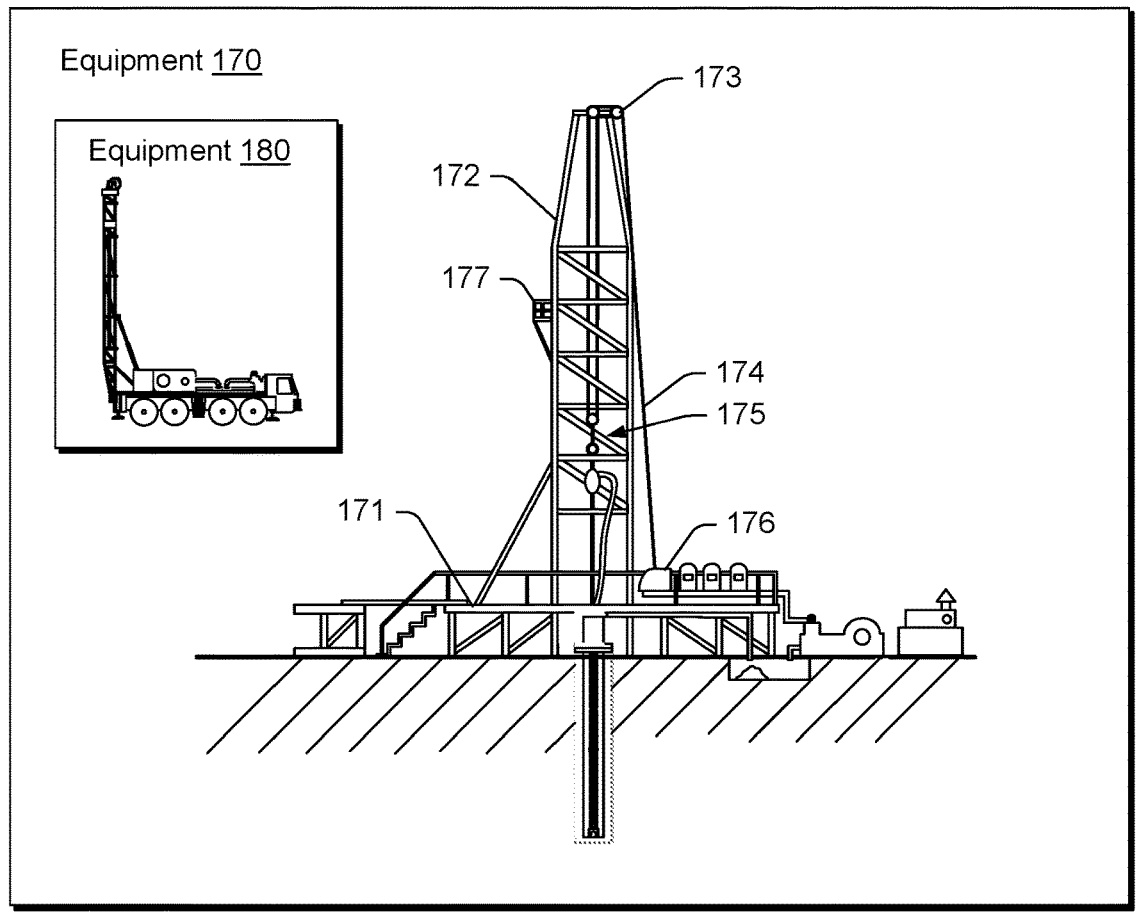

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrickman may be a rig crew member that works on a platform attached to a derrick or a mast. A derrick can include a landing on which a derrickman may stand. As an example, such a landing may be about 10 meters or more above a rig floor. In an operation referred to as trip out of the hole (TOH), a derrickman may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrickman controls the machinery rather than physically handling the pipe.

As an example, a trip may refer to the act of pulling equipment from a bore and/or placing equipment in a bore. As an example, equipment may include a drillstring that can be pulled out of a hole and/or placed or replaced in a hole. As an example, a pipe trip may be performed where a drill bit has dulled or has otherwise ceased to drill efficiently and is to be replaced.

Figure 2:
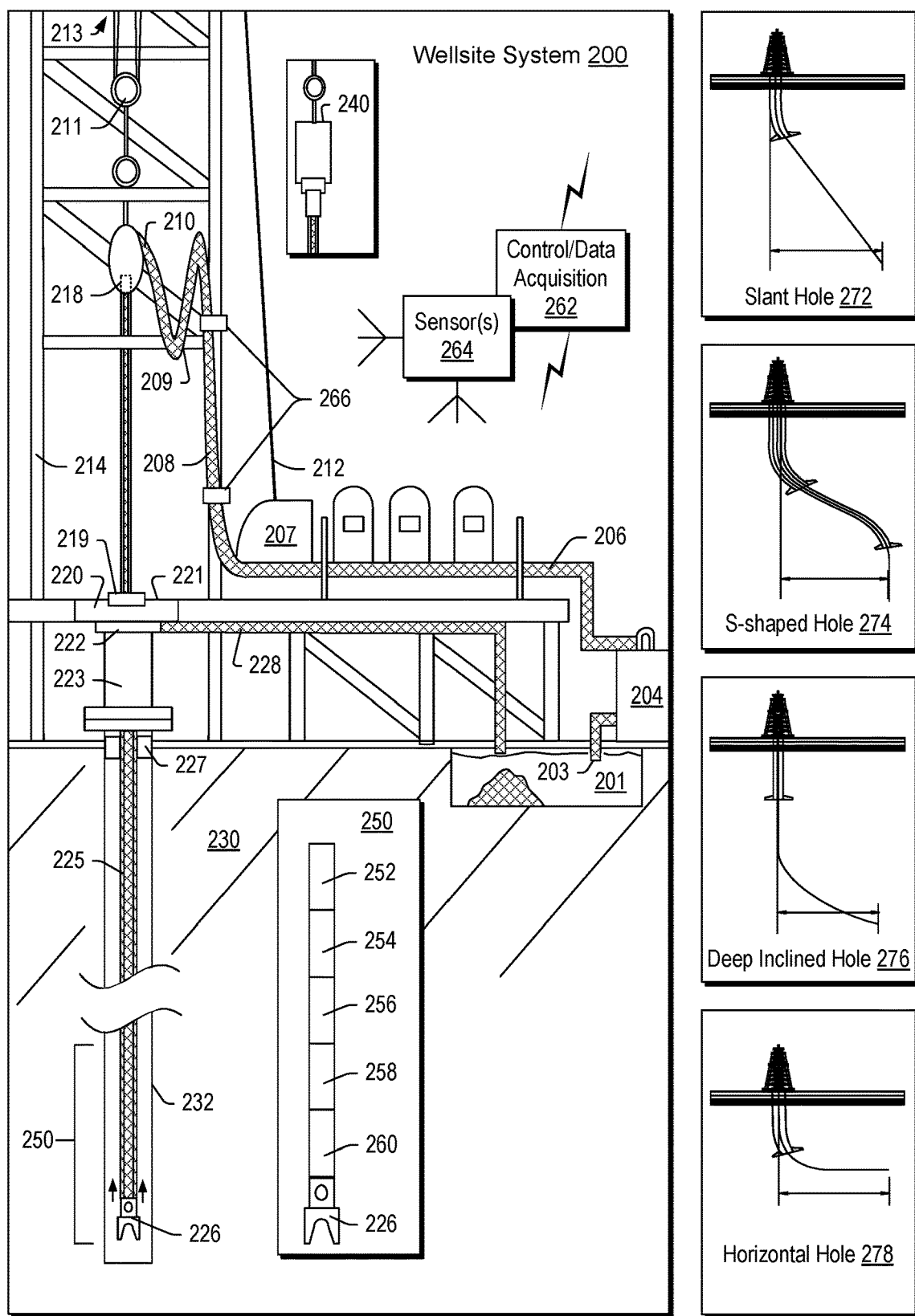
FIG. 2 illustrates examples of equipment and examples of hole types.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226. Such components or modules may be referred to as tools where a drillstring can include a plurality of tools.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform a method such as geosteering. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
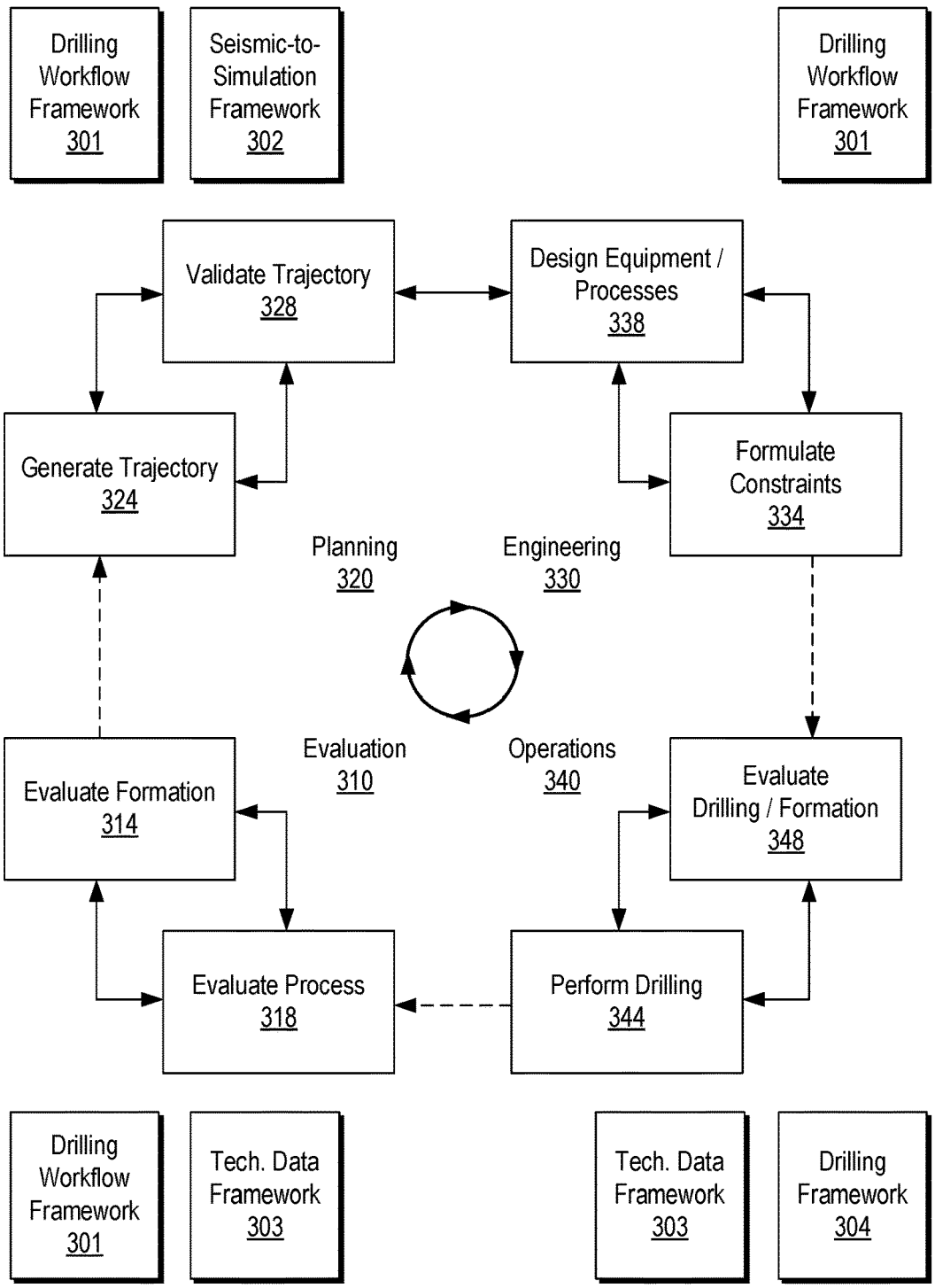
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL® framework (Schlumberger Limited, Houston, Tex.) and the technical data framework 303 can be, for example, the TECHLOG® framework (Schlumberger Limited, Houston, Tex.).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. An example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE® reservoir simulator (Schlumberger Limited, Houston Tex.), the INTERSECT® reservoir simulator (Schlumberger Limited, Houston Tex.), etc.

The aforementioned PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the framework environment marketed as the OCEAN® framework environment (Schlumberger Limited, Houston, Tex.), which allows for integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the OCEAN® framework where the model simulation layer can include or operatively link to the PETREL® model-centric software package that hosts OCEAN® framework applications. In an example embodiment, the PETREL® software may be considered a data-driven application. The PETREL® software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL® software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA® framework, marketed by Schlumberger Limited, Houston, Tex.) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL® framework, etc.).

As an example, a workflow may be a process implementable at least in part in the OCEAN® framework. As an example, a workflow may include one or more worksteps that access a module such as a plug-in (e.g., external executable code, etc.).

As an example, a framework may provide for modeling petroleum systems. For example, the modeling framework marketed as the PETROMOD® framework (Schlumberger Limited, Houston, Tex.) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG® framework. As an example, the TECHLOG® framework can be interoperable with one or more other frameworks such as, for example, the PETREL® framework.

As an example, various aspects of a workflow may be completed automatically, may be partially automated, or may be completed manually, as by a human user interfacing with a software application. As an example, a workflow may be cyclic, and may include, as an example, four stages such as, for example, an evaluation stage (see, e.g., the evaluation equipment 310), a planning stage (see, e.g., the planning equipment 320), an engineering stage (see, e.g., the engineering equipment 330) and an execution stage (see, e.g., the operations equipment 340). As an example, a workflow may commence at one or more stages, which may progress to one or more other stages (e.g., in a serial manner, in a parallel manner, in a cyclical manner, etc.).

As an example, a workflow can commence with an evaluation stage, which may include a geological service provider evaluating a formation (see, e.g., the evaluation block 314). As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory (see, e.g., the generation block 324), which may involve execution of one or more G&G software packages. Examples of such software packages include the PETREL® framework. As an example, a G&G service provider may determine a well trajectory or a section thereof, based on, for example, one or more model(s) provided by a formation evaluation (e.g., per the evaluation block 314), and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

As an example, a workflow may progress to a first engineering service provider (e.g., one or more processing machines associated therewith), which may validate a well trajectory and, for example, relief well design (see, e.g., the validation block 328). Such a validation process may include evaluating physical properties, calculations, risk tolerances, integration with other aspects of a workflow, etc. As an example, one or more parameters for such determinations may be maintained by a server and/or by the first engineering service provider; noting that one or more model(s), well trajectory(ies), etc. may be maintained by a server and accessed by the first engineering service provider. For example, the first engineering service provider may include one or more computing systems executing one or more software packages. As an example, where the first engineering service provider rejects or otherwise suggests an adjustment to a well trajectory, the well trajectory may be adjusted or a message or other notification sent to the G&G service provider requesting such modification.

As an example, one or more engineering service providers (e.g., first, second, etc.) may provide a casing design, bottom-hole assembly (BHA) design, fluid design, and/or the like, to implement a well trajectory (see, e.g., the design block 338). In some embodiments, a second engineering service provider may perform such design using one of more software applications. Such designs may be stored in one or more databases maintained by one or more servers, which may, for example, employ STUDIO® framework tools, and may be accessed by one or more of the other service providers in a workflow.

As an example, a second engineering service provider may seek approval from a third engineering service provider for one or more designs established along with a well trajectory. In such an example, the third engineering service provider may consider various factors as to whether the well engineering plan is acceptable, such as economic variables (e.g., oil production forecasts, costs per barrel, risk, drill time, etc.), and may request authorization for expenditure, such as from the operating company's representative, well-owner's representative, or the like (see, e.g., the formulation block 334). As an example, at least some of the data upon which such determinations are based may be stored in one or more database maintained by one or more servers. As an example, a first, a second, and/or a third engineering service provider may be provided by a single team of engineers or even a single engineer, and thus may or may not be separate entities.

As an example, where economics may be unacceptable or subject to authorization being withheld, an engineering service provider may suggest changes to casing, a bottom-hole assembly, and/or fluid design, or otherwise notify and/or return control to a different engineering service provider, so that adjustments may be made to casing, a bottom-hole assembly, and/or fluid design. Where modifying one or more of such designs is impracticable within well constraints, trajectory, etc., the engineering service provider may suggest an adjustment to the well trajectory and/or a workflow may return to or otherwise notify an initial engineering service provider and/or a G&G service provider such that either or both may modify the well trajectory.

As an example, a workflow can include considering a well trajectory, including an accepted well engineering plan, and a formation evaluation. Such a workflow may then pass control to a drilling service provider, which may implement the well engineering plan, establishing safe and efficient drilling, maintaining well integrity, and reporting progress as well as operating parameters (see, e.g., the blocks 344 and 348). As an example, operating parameters, formation encountered, data collected while drilling (e.g., using logging-while-drilling or measuring-while-drilling technology), may be returned to a geological service provider for evaluation. As an example, the geological service provider may then re-evaluate the well trajectory, or one or more other aspects of the well engineering plan, and may, in some cases, and potentially within predetermined constraints, adjust the well engineering plan according to the real-life drilling parameters (e.g., based on acquired data in the field, etc.).

Whether the well is entirely drilled, or a section thereof is completed, depending on the specific embodiment, a workflow may proceed to a post review (see, e.g., the evaluation block 318). As an example, a post review may include reviewing drilling performance. As an example, a post review may further include reporting the drilling performance (e.g., to one or more relevant engineering, geological, or G&G service providers).

Various activities of a workflow may be performed consecutively and/or may be performed out of order (e.g., based partially on information from templates, nearby wells, etc. to fill in any gaps in information that is to be provided by another service provider). As an example, undertaking one activity may affect the results or basis for another activity, and thus may, either manually or automatically, call for a variation in one or more workflow activities, work products, etc. As an example, a server may allow for storing information on a central database accessible to various service providers where variations may be sought by communication with an appropriate service provider, may be made automatically, or may otherwise appear as suggestions to the relevant service provider. Such an approach may be considered to be a holistic approach to a well workflow, in comparison to a sequential, piecemeal approach.

As an example, various actions of a workflow may be repeated multiple times during drilling of a wellbore. For example, in one or more automated systems, feedback from a drilling service provider may be provided at or near real-time, and the data acquired during drilling may be fed to one or more other service providers, which may adjust its piece of the workflow accordingly. As there may be dependencies in other areas of the workflow, such adjustments may permeate through the workflow, e.g., in an automated fashion. In some embodiments, a cyclic process may additionally or instead proceed after a certain drilling goal is reached, such as the completion of a section of the wellbore, and/or after the drilling of the entire wellbore, or on a per-day, week, month, etc. basis.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

As an example, a system can allow for a reduction in waste, for example, as may be defined according to LEAN.

In the context of LEAN, consider one or more of the following types of waste: transport (e.g., moving items unnecessarily, whether physical or data); inventory (e.g., components, whether physical or informational, as work in process, and finished product not being processed); motion (e.g., people or equipment moving or walking unnecessarily to perform desired processing); waiting (e.g., waiting for information, interruptions of production during shift change, etc.); overproduction (e.g., production of material, information, equipment, etc. ahead of demand); over Processing (e.g., resulting from poor tool or product design creating activity); and defects (e.g., effort involved in inspecting for and fixing defects whether in a plan, data, equipment, etc.). As an example, a system that allows for actions (e.g., methods, workflows, etc.) to be performed in a collaborative manner can help to reduce one or more types of waste.

As an example, a system can be utilized to implement a method for facilitating distributed well engineering, planning, and/or drilling system design across multiple computation devices where collaboration can occur among various different users (e.g., some being local, some being remote, some being mobile, etc.). In such a system, the various users via appropriate devices may be operatively coupled via one or more networks (e.g., local and/or wide area networks, public and/or private networks, land-based, marine-based and/or areal networks, etc.).

As an example, a system may allow well engineering, planning, and/or drilling system design to take place via a subsystems approach where a wellsite system is composed of various subsystem, which can include equipment subsystems and/or operational subsystems (e.g., control subsystems, etc.). As an example, computations may be performed using various computational platforms/devices that are operatively coupled via communication links (e.g., network links, etc.). As an example, one or more links may be operatively coupled to a common database (e.g., a server site, etc.). As an example, a particular server or servers may manage receipt of notifications from one or more devices and/or issuance of notifications to one or more devices. As an example, a system may be implemented for a project where the system can output a well plan, for example, as a digital well plan, a paper well plan, a digital and paper well plan, etc. Such a well plan can be a complete well engineering plan or design for the particular project.

Figure 4:
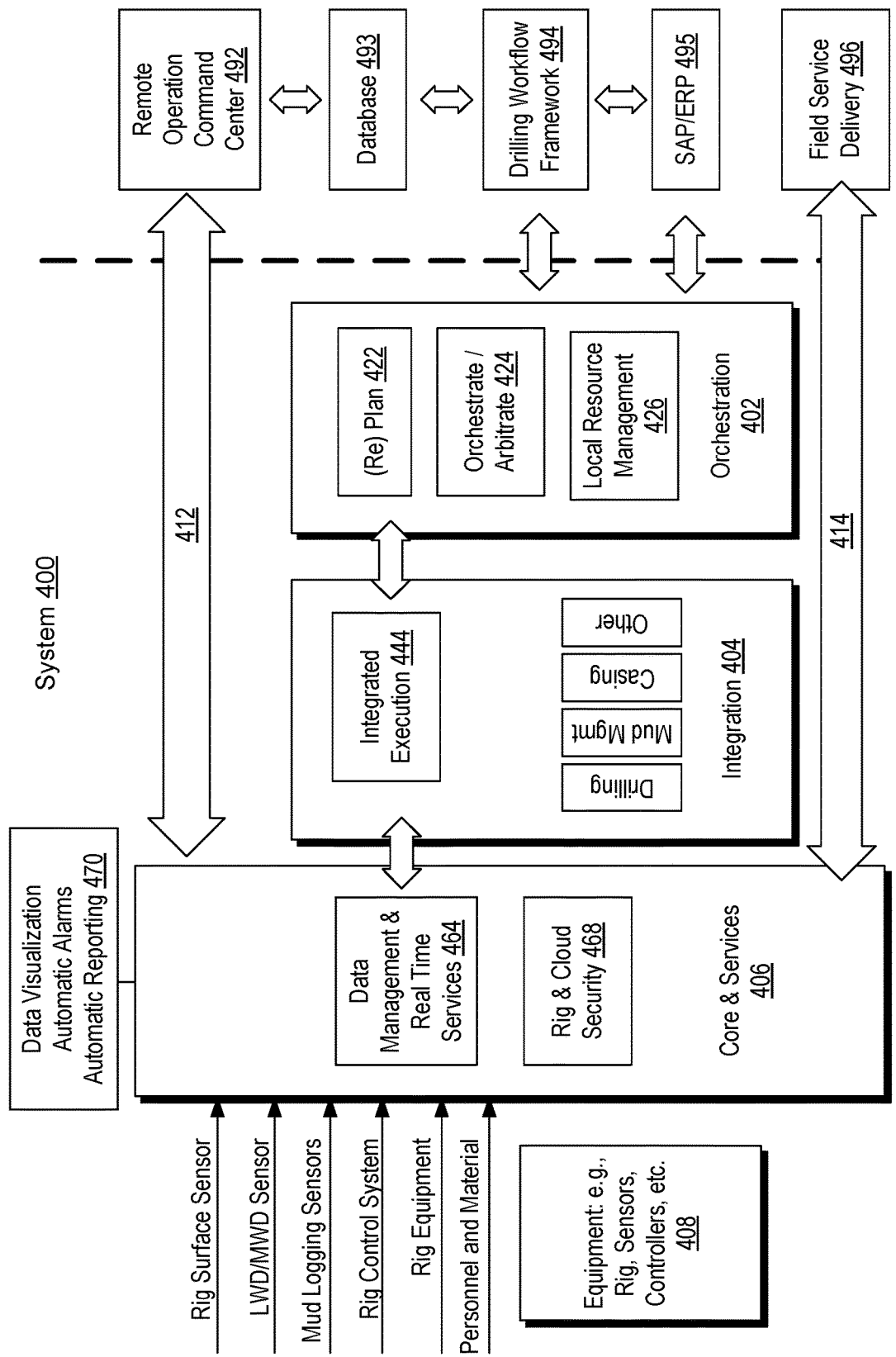
FIG. 4 illustrates an example of a system.

FIG. 4 shows an example of a system 400 that includes various components that can be local to a wellsite and includes various components that can be remote from a wellsite. As shown, the system 400 includes an orchestration block 402, an integration block 404, a core and services block 406 and an equipment block 408. These blocks can be labeled in one or more manners other than as shown in the example of FIG. 4. In the example of FIG. 4, the blocks 402, 404, 406 and 408 can be defined by one or more of operational features, functions, relationships in an architecture, etc.

As an example, the blocks 402, 404, 406 and 408 may be described in a pyramidal architecture where, from peak to base, a pyramid includes the orchestration block 402, the integration block 404, the core and services block 406 and the equipment block 408.

As an example, the orchestration block 402 can be associated with a well management level (e.g., well planning and/or orchestration) and can be associated with a rig management level (e.g., rig dynamic planning and/or orchestration). As an example, the integration block 404 can be associated with a process management level (e.g., rig integrated execution). As an example, the core and services block 406 can be associated with a data management level (e.g., sensor, instrumentation, inventory, etc.). As an example, the equipment block 408 can be associated with a wellsite equipment level (e.g., wellsite subsystems, etc.).

As an example, the orchestration block 402 may receive information from a drilling workflow framework and/or one or more other sources, which may be remote from a wellsite.

In the example of FIG. 4, the orchestration block 402 includes a plan/replan block 422, an orchestrate/arbitrate block 424 and a local resource management block 426. In the example of FIG. 4, the integration block 404 includes an integrated execution block 444, which can include or be operatively coupled to blocks for various subsystems of a wellsite such as a drilling subsystem, a mud management subsystem (e.g., a hydraulics subsystem), a casing subsystem (e.g., casings and/or completions subsystem), and, for example, one or more other subsystems. In the example of FIG. 4, the core and services block 406 includes a data management and real-time services block 464 (e.g., real-time or near real-time services) and a rig and cloud security block 468 (e.g., as to provisioning and various type of security measures, etc.). In the example of FIG. 4, the equipment block 408 is shown as being capable of providing various types of information to the core and services block 406. For example, consider information from a rig surface sensor, a LWD/MWD sensor, a mud logging sensor, a rig control system, rig equipment, personnel, material, etc. In the example, of FIG. 4, a block 470 can provide for one or more of data visualization, automatic alarms, automatic reporting, etc. As an example, the block 470 may be operatively coupled to the core and services block 406 and/or one or more other blocks.

As mentioned, a portion of the system 400 can be remote from a wellsite. For example, to one side of a dashed line appear a remote operation command center block 492, a database block 493, a drilling workflow framework block 494, a SAP/ERP block 495 and a field services delivery block 496. Various blocks that may be remote can be operatively coupled to one or more blocks that may be local to a wellsite system. For example, a communication link 412 is illustrated in the example of FIG. 4 that can operatively couple the blocks 406 and 492 (e.g., as to monitoring, remote control, etc.), while another communication link 414 is illustrated in the example of FIG. 4 that can operatively couple the blocks 406 and 496 (e.g., as to equipment delivery, equipment services, etc.). Various other examples of possible communication links are also illustrated in the example of FIG. 4.

As an example, the system 400 of FIG. 4 may be a field management tool. As an example, the system 400 of FIG. 4 may include a drilling framework (see, e.g., the drilling framework 304). As an example, blocks in the system 400 of FIG. 4 that may be remote from a wellsite.

As an example, a wellbore can be drilled according to a drilling plan that is established prior to drilling. Such a drilling plan, which may be a well plan or a portion thereof, can set forth equipment, pressures, trajectories and/or other parameters that define drilling process for a wellsite. As an example, a drilling operation may then be performed according to the drilling plan (e.g., well plan). As an example, as information is gathered, a drilling operation may deviate from a drilling plan. Additionally, as drilling or other operations are performed, subsurface conditions may change. Specifically, as new information is collected, sensors may transmit data to one or more surface units. As an example, a surface unit may automatically use such data to update a drilling plan (e.g., locally and/or remotely).

As an example, the drilling workflow framework 494 can be or include a G&G system and a well planning system. As an example, a G&G system corresponds to hardware, software, firmware, or a combination thereof that provides support for geology and geophysics. In other words, a geologist who understands the reservoir may decide where to drill the well using the G&G system that creates a three-dimensional model of the subsurface formation and includes simulation tools. The G&G system may transfer a well trajectory and other information selected by the geologist to a well planning system. The well planning system corresponds to hardware, software, firmware, or a combination thereof that produces a well plan. In other words, the well plan may be a high-level drilling program for the well. The well planning system may also be referred to as a well plan generator.

In the example of FIG. 4, various blocks can be components that may correspond to one or more software modules, hardware infrastructure, firmware, equipment, or any combination thereof. Communication between the components may be local or remote, direct or indirect, via application programming interfaces, and procedure calls, or through one or more communication channels.

As an example, various blocks in the system 400 of FIG. 4 can correspond to levels of granularity in controlling operations of associated with equipment and/or personnel in an oilfield. As shown in FIG. 4, the system 400 can include the orchestration block 402 (e.g., for well plan execution), the integration block 404 (e.g., process manager collection), the core and services block 406, and the equipment block 408.

The orchestration block 402 may be referred to as a well plan execution system. For example, a well plan execution system corresponds to hardware, software, firmware or a combination thereof that performs an overall coordination of the well construction process, such as coordination of a drilling rig and the management of the rig and the rig equipment. A well plan execution system may be configured to obtain the general well plan from well planning system and transform the general well plan into a detailed well plan. The detailed well plan may include a specification of the activities involved in performing an action in the general well plan, the days and/or times to perform the activities, the individual resources performing the activities, and other information.

As an example, a well plan execution system may further include functionality to monitor an execution of a well plan to track progress and dynamically adjust the plan. Further, a well plan execution system may be configured to handle logistics and resources with respect to on and off the rig. As an example, a well plan execution system may include multiple sub-components, such as a detailer that is configured to detail the well planning system plan, a monitor that is configured to monitor the execution of the plan, a plan manager that is configured to perform dynamic plan management, and a logistics and resources manager to control the logistics and resources of the well. In one or more embodiments, a well plan execution system may be configured to coordinate between the different processes managed by a process manager collection (see, e.g., the integration block 404). In other words, a well plan execution system can communicate and manage resource sharing between processes in a process manager collection while operating at, for example, a higher level of granularity than process manager collection.

As to the integration block 404, as mentioned, it may be referred to as a process manager collection. In one or more embodiments, a process manager collection can include functionality to perform individual process management of individual domains of an oilfield, such as a rig. For example, when drilling a well, different activities may be performed. Each activity may be controlled by an individual process manager in the process manager collection. A process manager collection may include multiple process managers, whereby each process manager controls a different activity (e.g., activity related to the rig). In other words, each process manager may have a set of tasks defined for the process manager that is particular to the type of physics involved in the activity. For example, drilling a well may use drilling mud, which is fluid pumped into well in order to extract drill cuttings from the well. A drilling mud process manager may exist in a process manager collection that manages the mixing of the drilling mud, the composition, testing of the drilling mud properties, determining whether the pressure is accurate, and performing other such tasks. The drilling mud process manager may be separate from a process manager that controls movement of drill pipe from a well. Thus, a process manager collection may partition activities into several different domains and manages each of the domains individually. Amongst other possible process managers, a process manager collection may include, for example, a drilling process manager, a mud preparation and management process manager, a casing running process manager, a cementing process manager, a rig equipment process manager, and other process managers. Further, a process manager collection may provide direct control or advice regarding the components above. As an example, coordination between process managers in a process manager collection may be performed by a well plan execution system.

As to the core and services block 406 (e.g., CS block), it can include functionality to manage individual pieces of equipment and/or equipment subsystems. As an example, a CS block can include functionality to handle basic data structure of the oilfield, such as the rig, acquire metric data, produce reports, and manages resources of people and supplies. As an example, a CS block may include a data acquirer and aggregator, a rig state identifier, a real-time (RT) drill services (e.g., near real-time), a reporter, a cloud, and an inventory manager.

As an example, a data acquirer and aggregator can include functionality to interface with individual equipment components and sensor and acquire data. As an example, a data acquirer and aggregator may further include functionality to interface with sensors located at the oilfield.

As an example, a rig state identifier can includes functionality to obtain data from the data acquirer and aggregator and transform the data into state information. As an example, state information may include health and operability of a rig as well as information about a particular task being performed by equipment.

As an example, RT drill services can include functionality to transmit and present information to individuals. In particular, the RT drill services can include functionality to transmit information to individuals involved according to roles and, for example, device types of each individual (e.g., mobile, desktop, etc.). In one or more embodiments, information presented by RT drill services can be context specific, and may include a dynamic display of information so that a human user may view details about items of interest.

As an example, in one or more embodiments, a reporter can include functionality to generate reports. For example, reporting may be based on requests and/or automatic generation and may provide information about state of equipment and/or people.

As an example, a wellsite "cloud" framework can correspond to an information technology infrastructure locally at an oilfield, such as an individual rig in the oilfield. In such an example, the wellsite "cloud" framework may be an "Internet of Things" (IoT) framework. As an example, a wellsite "cloud" framework can be an edge of the cloud (e.g., a network of networks) or of a private network.

As an example, an inventory manager can be a block that includes functionality to manage materials, such as a list and amount of each resource on a rig.

In the example of FIG. 4, the equipment block 408 can correspond to various controllers, control unit, control equipment, etc. that may be operatively coupled to and/or embedded into physical equipment at a wellsite such as, for example, rig equipment. For example, the equipment block 408 may correspond to software and control systems for individual items on the rig. As an example, the equipment block 408 may provide for monitoring sensors from multiple subsystems of a drilling rig and provide control commands to multiple subsystem of the drilling rig, such that sensor data from multiple subsystems may be used to provide control commands to the different subsystems of the drilling rig and/or other devices, etc. For example, a system may collect temporally and depth aligned surface data and downhole data from a drilling rig and transmit the collected data to data acquirers and aggregators in core services, which can store the collected data for access onsite at a drilling rig or offsite via a computing resource environment.

As mentioned, the system 400 of FIG. 4 can be associated with a plan where, for example, the plan/replan block 422 can provide for planning and/or re-planning one or more operations, etc.

Figure 5:
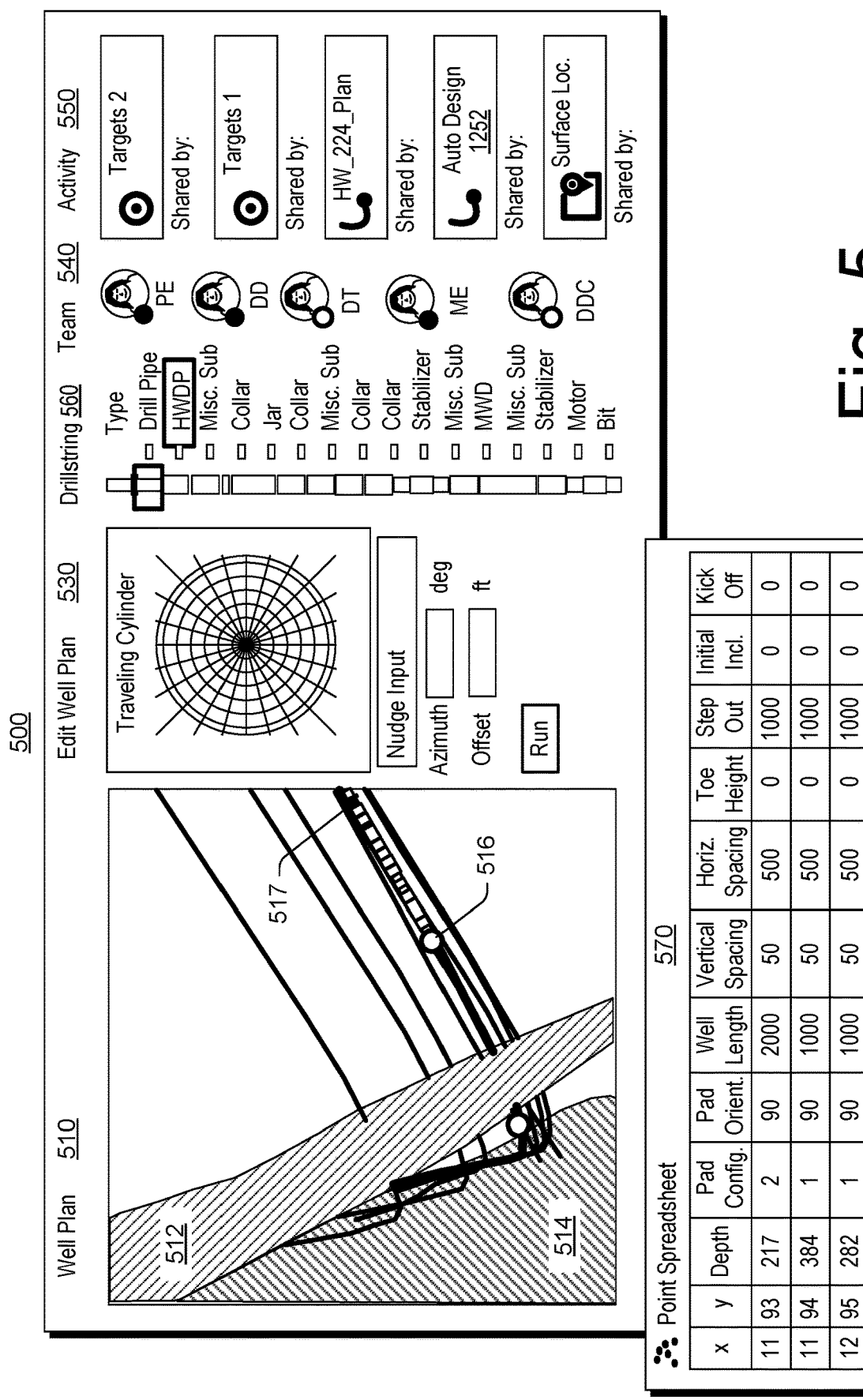
FIG. 5 illustrates an example of a graphical user interface.

FIG. 5 shows an example of a graphical user interface (GUI) 500 that includes information associated with a well plan. Specifically, the GUI 500 includes a panel 510 where surfaces representations 512 and 514 are rendered along with well trajectories where a location 516 can represent a position of a drillstring 517 along a well trajectory. The GUI 500 may include one or more editing features such as an edit well plan set of features 530. The GUI 500 may include information as to individuals of a team 540 that are involved, have been involved and/or are to be involved with one or more operations. The GUI 500 may include information as to one or more activities 550. As shown in the example of FIG. 5, the GUI 500 can include a graphical control of a drillstring 560 where, for example, various portions of the drillstring 560 may be selected to expose one or more associated parameters (e.g., type of equipment, equipment specifications, operational history, etc.). FIG. 5 also shows a table 570 as a point spreadsheet that specifies information for a plurality of wells.

Figure 6:
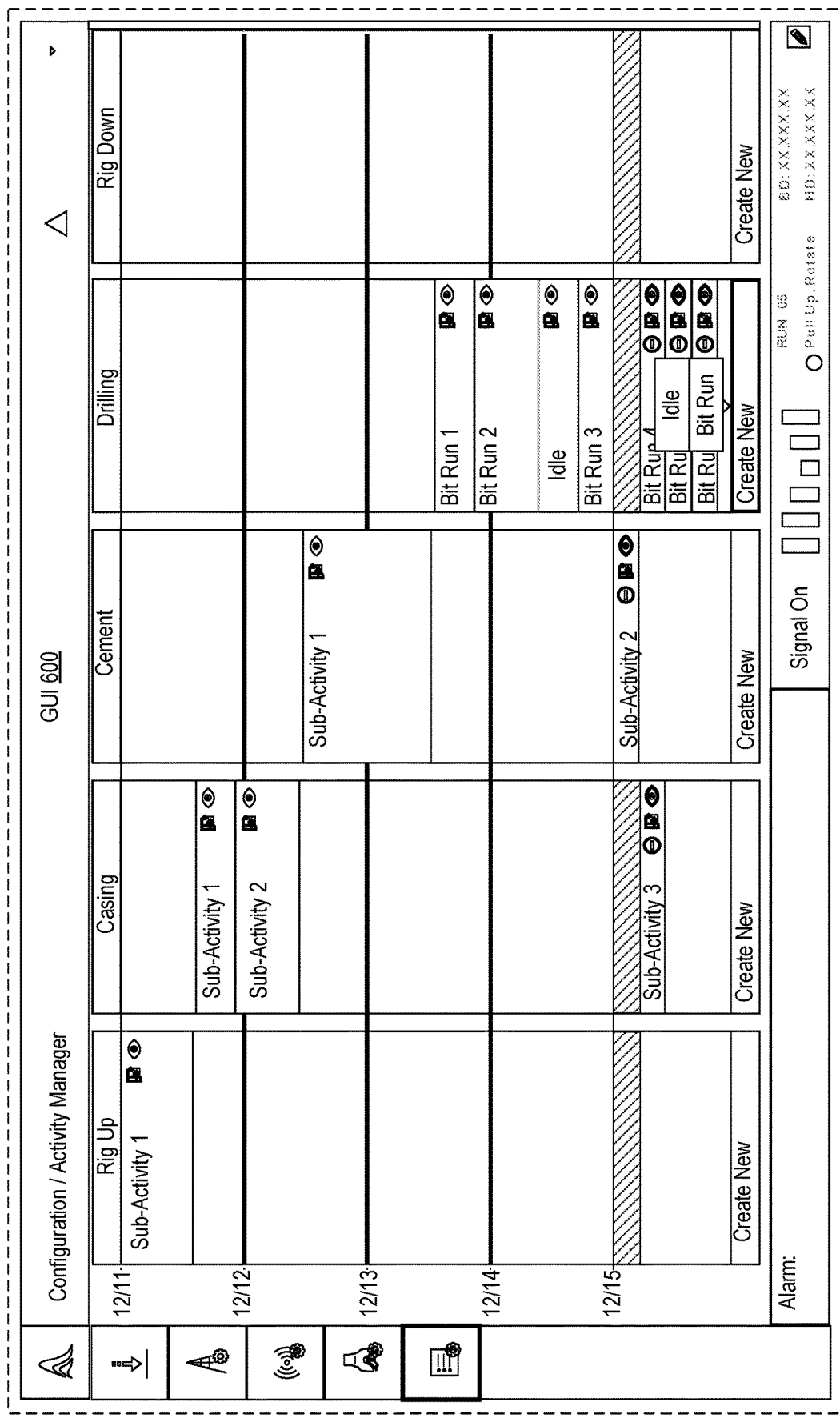
FIG. 6 illustrates an example of a graphical user interface.

FIG. 6 shows an example of a graphical user interface (GUI) 600 that includes a calendar with dates for various operations that can be part of a plan. For example, the GUI 600 shows rig up, casing, cement, drilling and rig down operations that can occur over various periods of time. Such a GUI may be editable via selection of one or more graphical controls.

Various types of data associated with field operations can be 1-D series data. For example, consider data as to one or more of a drilling system, downhole states, formation attributes, and surface mechanics being measured as single or multi-channel time series data.

Figure 7:
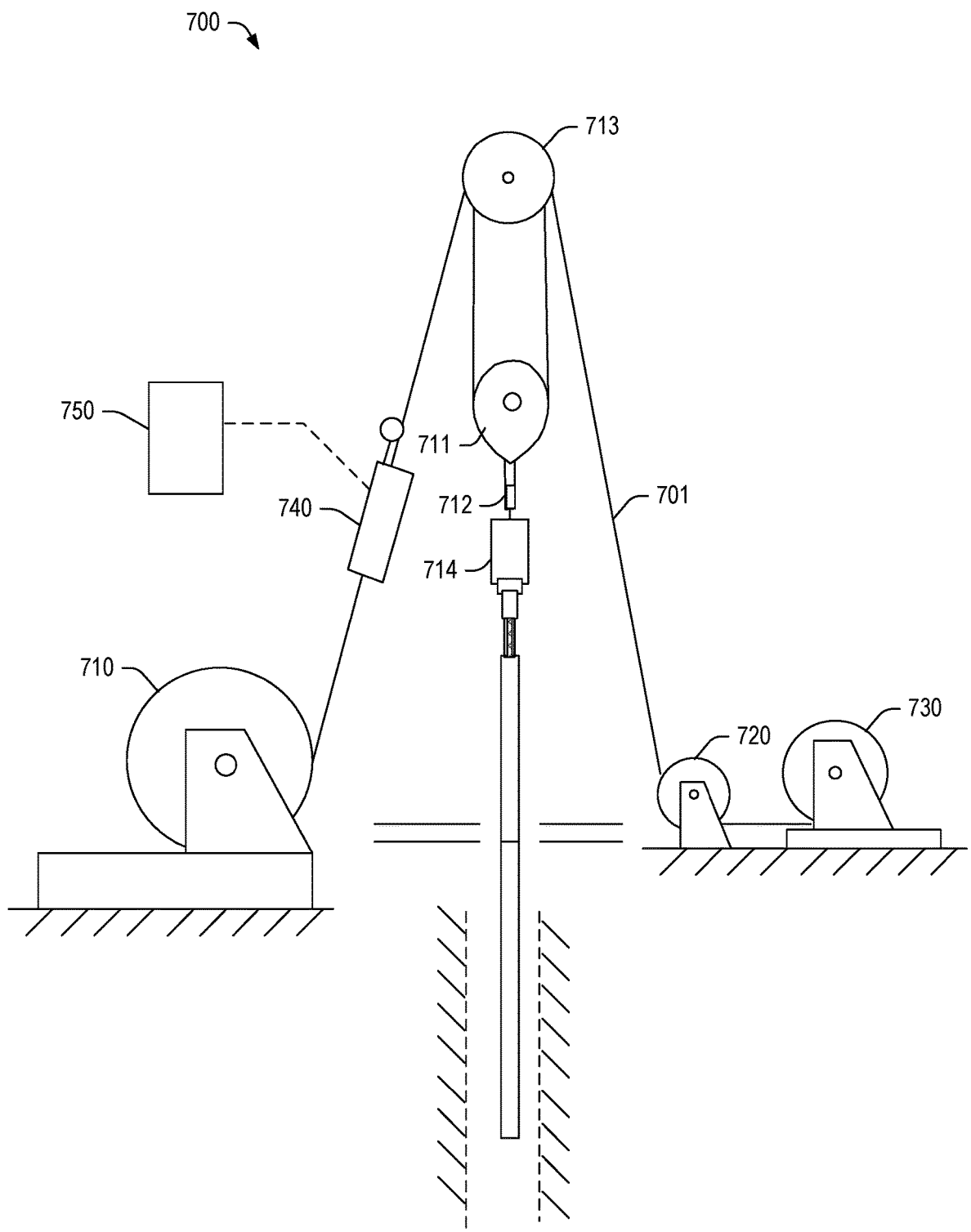
FIG. 7 illustrates an example of a system.

FIG. 7 shows an example of various components of a hoisting system 700, which includes a cable 701, drawworks 710, a traveling block 711, a hook 712, a crown block 713, a top drive 714, a cable deadline tiedown anchor 720, a cable supply reel 730, one or more sensors 740 and circuitry 750 operatively coupled to the one or more sensors 740. In the example of FIG. 7, the hoisting system 700 can include various sensors, which may include one or more of load sensors, displacement sensors, accelerometers, etc. As an example, the cable deadline tiedown anchor 720 may be fit with a load cell (e.g., a load sensor).

The hoisting system 700 may be part of a wellsite system (see, e.g., FIG. 1 and FIG. 2). In such a system, a measurement channel can be a block position measurement channel, referred to as BPOS, which provides measurements of a height of a traveling block, which may be defined about a deadpoint (e.g., zero point) and may have deviations from that deadpoint in positive and/or negative directions. For example, consider a traveling block that can move in a range of approximately −5 meters to +45 meters, for a total excursion of approximately 50 meters. In such an example, a rig height can be greater than approximately 50 meters (e.g., a crown block can be set at a height from the ground or rig floor in excess of approximately 50 meters). While various examples are given for land-based field operations (e.g., fixed, truck-based, etc.), various methods can apply for marine-based operations (e.g., vessel-based rigs, platform rigs, etc.).

BPOS is a type of real-time channel that reflects surface mechanical properties of a rig. Another example of a channel is hookload, which can be referred to as HKLD. HKLD can be a 1-D series measurement of the load of a hook. As to a derivative, a first derivative can be a load velocity and a second derivative can be a load acceleration. Such data channels can be utilized to infer and monitor various operations and/or conditions. In some examples, a rig may be represented as being in one or more states, which may be referred to as rig states.

As to the HKLD channel, it can help to detect if a rig is "in slips", while the BPOS channel can be a primary channel for depth tracking during drilling. For example, BPOS can be utilized to determine a measured depth in a geologic environment (e.g., a borehole being drilled, etc.). As to the condition or state "in slips", HKLD is at a much lower value than in the condition or state "out of slips".

The term slips refers to a device or assembly that can be used to grip a drillstring (e.g., drillcollar, drillpipe, etc.) in a relatively non-damaging manner and suspend it in a rotary table. Slips can include three or more steel wedges that are hinged together, forming a near circle around a drillpipe. On the drillpipe side (inside surface), the slips are fitted with replaceable, hardened tool steel teeth that embed slightly into the side of the pipe. The outsides of the slips are tapered to match the taper of the rotary table. After the rig crew places the slips around the drillpipe and in the rotary, a driller can control a rig to slowly lower the drillstring. As the teeth on the inside of the slips grip the pipe, the slips are pulled down. This downward force pulls the outer wedges down, providing a compressive force inward on the drillpipe and effectively locking components together. Then the rig crew can unscrew the upper portion of the drillstring (e.g., a kelly, saver sub, a joint or stand of pipe) while the lower part is suspended. After some other component is screwed onto the lower part of the drillstring, the driller raises the drillstring to unlock the gripping action of the slips, and a rig crew can remove the slips from the rotary.

A hookload sensor can be used to measure a weight of load on a drillstring and can be used to detect whether a drillstring is in-slips or out-of-slips. When the drill string is in-slips, motion from the blocks or motion compensator do not have an effect on the depth of a drill bit at the end of the drillstring (e.g., it will tend to remain stationary). Where movement of a traveling block is via a drawworks encoder (DWE), which can be mounted on a shaft of the drawworks, acquired DWE information (e.g., BPOS) does not augment the recorded drill bit depth. When a drillstring is out-of-slips (e.g., drilling ahead), DWE information (e.g., BPOS) can augment the recorded bit depth. The difference in hookload weight (HKLD) between in-slips and out-of-slips tends to be distinguishable. As to marine operations, heave of a vessel can affect bit depth whether a drillstring is in-slips or out-of-slips. As an example, a vessel can include one or more heave sensors, which may sense data that can be recorded as 1-D series data.

As to marine operations, a vessel may experience various types of motion, such as, for example, one or more of heave, sway and surge. Heave is a linear vertical (up/down) motion, sway is linear lateral (side-to-side or port-starboard) motion, and surge is linear longitudinal (front/back or bow/stern) motion imparted by maritime conditions. As an example, a vessel can include one or more heave sensors, one or more sway sensors and/or one or more surge sensors, each of which may sense data that can be recorded as 1-D series data.

As an example, BPOS alone, or combined with one or more other channels, can be used to detect whether a rig is "on bottom" drilling or "tripping", etc. An inferred state may be further consumed by one or more systems such as, for example, an automatic drilling control system, which may be a dynamic field operations system or a part thereof. In such an example, the conditions, operations, states, etc., as discerned from BPOS and/or other channel data may be predicates to making one or more drilling decisions, which may include one or more control decisions (e.g., of a controller that is operatively coupled to one or more pieces of field equipment, etc.).

A block can be a set of pulleys used to gain mechanical advantage in lifting or dragging heavy objects. There can be two blocks on a drilling rig, the crown block and the traveling block. Each can include several sheaves that are rigged with steel drilling cable or line such that the traveling block may be raised (or lowered) by reeling in (or out) a spool of drilling line on the drawworks. As such, block position can refer to the position of the traveling block, which can vary with respect to time. FIG. 1 shows the traveling block assembly 175, FIG. 2 shows the traveling block 211 and FIG. 7 shows the traveling block 711.

A hook can be high-capacity J-shaped equipment used to hang various equipment such as a swivel and kelly, elevator bails, or a topdrive. FIG. 7 shows the hook 712 as operatively coupled to a topdrive 714. As shown in FIG. 2, a hook can be attached to the bottom of the traveling block 211 (e.g., part of the traveling block assembly 175 of FIG. 1). A hook can provide a way to pick up heavy loads with a traveling block. The hook may be either locked (e.g., a normal condition) or free to rotate, so that it may be mated or decoupled with items positioned around the rig floor, etc.

Hookload can be the total force pulling down on a hook as carried by a traveling block. The total force includes the weight of the drillstring in air, the drill collars and any ancillary equipment, reduced by forces that tend to reduce that weight. Some forces that might reduce the weight include friction along a bore wall (especially in deviated wells) and buoyant forces on a drillstring caused by its immersion in drilling fluid (e.g., and/or other fluid). If a blowout preventer (BOP) (e.g., or BOPs) is closed, pressure in a bore acting on cross-sectional area of a drillstring in the BOP can also exert an upward force.

A standpipe can be a rigid metal conduit that provides a high-pressure pathway for drilling fluid to travel approximately one-third of the way up the derrick, where it connects to a flexible high-pressure hose (e.g., kelly hose). A large rig may be fitted with more than one standpipe so that downtime is kept to a minimum if one standpipe demands repair. FIG. 2 shows the standpipe 208 as being a conduit for drilling fluid (e.g., drilling mud, etc.). Pressure of fluid within the standpipe 208 can be referred to as standpipe pressure.

As to surface torque, such a measurement can be provided by equipment at a rig site. As an example, one or more sensors can be utilized to measure surface torque, which may provide for direct and/or indirect measurement of surface torque associated with a drillstring. As an example, equipment can include a drill pipe torque measurement and controller system with one or more of analog frequency output and digital output. As an example, a torque sensor may be associated with a coupling that includes a resilient element operatively joining an input element and an output element where the resilient element allows the input and output elements to twist with respect to one another in response to torque being transmitted through the torque sensor where the twisting can be measured and used to determine the torque being transmitted. As an example, such a coupling can be located between a drive and drill pipe. As an example, torque may be determined via an inertia sensor or sensors. As an example, equipment at a rig site can include one or more sensors for measurement and/or determination of torque (e.g., in units of Nm, etc.).

As an example, equipment can include a real-time drilling service system that may provide data such as weight transfer information, torque transfer information, equivalent circulation density (ECD) information, downhole mechanical specific energy (DMSE) information, motion information (e.g., as to stall, stick-slip, etc.), bending information, vibrational amplitude information (e.g., axial, lateral and/or torsional), rate of penetration (ROP) information, pressure information, differential pressure information, flow information, etc. As an example, sensor information may include inclination, azimuth, total vertical depth, etc. As an example, a system may provide information as to whirl (e.g., backward whirl, etc.) and may optionally provide information such as one or more alerts (e.g., "severe backward whirl: stop and restart with lower surface RPM", etc.).

As an example, a drillstring can include a tool or tools that include various sensors that can make various measurements. For example, consider the OPTIDRILL™ tool (Schlumberger Limited, Houston, Tex.), which includes strain gauges, accelerometers, magnetometer(s), gyroscope(s), etc. For example, such a tool can acquire weight on bit measurements (WOB) using a strain gauge (e.g., 10 second moving window with bandwidth of 200 Hz), torque measurements using a strain gauge (e.g., 10 second moving window with bandwidth of 200 Hz), bending moment using a strain gauge (e.g., 10 second moving window with bandwidth of 200 Hz), vibration using one or more accelerometers (e.g., 30 second RMS with bandwidth of 0.2 to 150 Hz), rotational speed using a magnetometer and a gyroscope (e.g., 30 moving window with bandwidth of 4 Hz), annular and internal pressures using one or more strain gauges (e.g., 1 second average with bandwidth of 200 Hz), annular and internal temperatures using one or more temperature sensors (1 second average with bandwidth of 10 Hz), and continuous inclination using an accelerometer (30 second average with bandwidth of 10 Hz).

As mentioned, channels of real time drilling operation data can be received and characterized using generated synthetic data, which may be generated based at least in part on one or more operational parameters associated with the real time drilling operation. Such real time drilling operation data can include surface data and/or downhole data. As mentioned, data availability may differ temporally (e.g., frequency, gaps, etc.) and/or otherwise (e.g., resolution, etc.). Such data may differ as to noise level and/or noise characteristics.

Complex dynamic systems are inherently difficult to characterize and control. The field of systems theory aims to understand nonlinear behavior of complex systems over time using various techniques, structures, etc. A dynamic system may be delineated by its spatial and temporal boundaries, surrounded and influenced by its environment, described by its structure and purpose or nature and expressed in its functioning. In terms of its effects, a dynamic system can be more than the sum of its parts if it expresses synergy or emergent behavior. In various instances, changing one part of a dynamic system can affect other parts.

As an example, a dynamic system can be interacted with according to an operating procedure (e.g., OP). For example, a dynamic system that includes rig equipment and an environment into which a borehole is to be formed, a well constructed, etc., can be interacted with according to an OP. For example, an OP or set of OPs can be an engineering plan for constructing a well. Such a plan can include well geometries, casing programs, mud considerations, well control concerns, initial bit selections, offset well information, pore pressure estimations, economics and special procedures that may be called upon during the course of constructing the well. While drilling procedures tend to be carefully developed, they can be subject to change if conditions dictate. However, understanding "conditions" based on available sensor data can be a substantial task. For example, a dynamic system can be underdetermined such that available sensor data does not tell the whole story of what physical conditions exist at a point in time. As an example, a driller may be following an OP; yet, the dynamic system does not behave in a fully expected manner, which may be undiscernible given a handful of channels of drilling data with respect to time (e.g., time series drilling data).

As an example, a computational system can be utilized to assess compliance with one or more OPs where the computational system includes an ability to compare an OP for interacting with a dynamic system to a sophisticated characterization of the dynamic system, for example, within a latent space (e.g., a feature space). Such a computational system can improve how equipment is operated to construct a product such as, for example, a well, or a portion thereof (e.g., a borehole, cement, casing, fracture, etc.). Such a computational system can reduce dimensionality of a dynamic system to a desired level such that a comparison between an OP and state of the dynamic system is possible and meaningful. For example, consider a computational system that includes a deep neural network (DNN) with a deep Kalman filter (DKF) where output of one or more recurrent layers (e.g., one or more recurrent units, which can include one or more long short-term memory (LSTM) units) can be in the form of a vector (e.g., n-dimensional vector) in a latent space (e.g., a feature space), which can be temporal in that indicators of different states of the dynamic system can be rendered for different times and, for example, where an OP may be cast as an indicator or indicators that can be rendered in the latent space for purposes of comparisons (e.g., including weighting of a particle filter, etc.). Such a reduced representation (e.g., encoded) of the dynamic system can be utilized for one or more purposes. Such a reduced representation may be, when compared to input, at least an order of magnitude less in dimensionality (e.g., consider two order or more of reduction).

As an example, a method can include comparing an operation procedure (OP) in well construction with an actual operation sequence as part of a process that allows for improving well construction, mitigating a well construction issue, etc. As an example, a method can include evaluating whether and how well an OP has been followed in execution of actions within a dynamic system.

As to prior techniques for comparison of a well construction operation with an OP, given the complexity of a dynamic well construction system, humans have relied primarily on "gut feel", without a proper quantitative, computational process that can, for example, provide an ability to utilize measurements to determine actual states that can be compared to OP "states" (e.g., states, state transitions, etc.). Compared with a conventional method that depends on laborious manual analysis, an example method can provide a systematic way to analyze a plan OP versus actual execution in relative detail (e.g., with respect to time, depth, etc.) to improve analytic accuracy, and cut time and cost.

As an example, a computational system can utilize a particle filter to track the temporal location of an observed drilling sequence with respect to an OP sequence. Such a computational system can employ a deep Kalman filter (DKF) approach to estimate weights of particles of the particle filter (e.g., hypotheses of actual state of a dynamic system). As an example, such a computational system can output the most likely temporal location on an OP (e.g., graphically, etc.), for example, estimated along with confidence level.

As an example, a computational system can be implemented for tracking of an OP as a localization problem. Such a computational system can include, for example: a map, particles, a state transition model, observation(s), and weight updating components. In such an example, the map can be simulated OP control signal instances and physical constraints; the particles can be with respect to multiple channels of a window (e.g., location, velocity/speed, and signals in the window); the state transition model can be for updating a window location based on its velocity/speed where a channel can be updated based on a delta observed from actual time series data (e.g., sensor data); an observation or observations can be actual multi-channel time series data (e.g., sensor data); and a weight updating component can be via a deep Kalman filter (DKF) where particle weights can be evaluated in a latent space defined in the DKF.

As an example, a method can include simulating a time series from an OP description for interacting with a dynamic system; defining particles on the simulated time series; training a deep Kalman filter (DKF) with actual time series sensor data of the dynamic system; updating the particles with state transition equations; calculating the weights of the particles by projecting the particles and observations (e.g., sensor data as characterized) onto a latent space of the trained deep Kalman filter (DKF); resampling the particles according to the weights calculated; and repeating the updating, the calculating and resampling until the observations are processed; and outputting a mapping of time location of the observation(s) with respect to the OP sequence and its confidence level.

As an example, given an OP and an actual operation sequence, such as "go on bottom in drilling", a computational system may answer the question: "how well does the actual operation follow the OP?" And, for example: "If not completely followed, where is the OP not followed?"

A computational system can provide a mechanism that can track, optionally in real time, prescribed actions of an OP as they are executed during actual drilling. Such a computational system may also estimate the confidence level of the OP step tracking. As an example, such a computational system can be operatively coupled to one or more displays where the computational system can render tracking in real time to one or more of the one or more displays. For example, in a driller's cabin (e.g., a doghouse), a display can be utilized where real time tracking is rendered to allow a driller to control one or more well construction operations. For example, where the driller is executing an OP that includes various actions, as those actions are being performed (e.g., sequentially, simultaneously, etc.), a computational system can receive sensor data and process that sensor data to allow for rendering of tracking data to the display, optionally with confidence values, such that the driller can determine if the OP is being followed properly (e.g., adequately) and/or whether the OP is having its intended result on the dynamic system. In such an example, the driller and/or a controller may utilize tracking data to control well construction (e.g., issue one or more signals to one or more pieces of equipment that are part of a dynamic system). In such a manner, well construction is improved by the ability to track and make comparisons, particularly where such comparisons are in a latent space that can include identifiable regions that can be visualized as corresponding to particular states of the dynamic system (e.g., equipment and environment).

As an example, a computational system can be specialized via circuitry, which can include processor-executable instructions stored in memory (e.g., memory cards or other memory devices) that upon execution by at least one processor cause the computational system to track a dynamic system responsive to receipt of sensor data (e.g., observables or measurables). Such tracking can be as to the state of the dynamic system in a latent space (e.g., feature space), as may be associated with a deep neural network (DNN). As an example, a computational system can provide for tracking a current operation with respect to an SOP in real time at signal level with confidence. As an example, a method may include comparing tracked data in a latent space with an arbitrary operation sequence at signal level without an OP being explicitly defined. As an example, a method can include optimizing an OP based on effects from an actual drilling sequence (e.g., as may be visualized in a latent space, a processed latent space, etc.).

As an example, a method can include defining a mapping function that maps time of observed signal(s) onto an OP time. Such a mapping function may be defined as follows:

$$t_{OP} = f(t_{obs})$$

As an example, a method can include determining confidence. For example, consider a comparison or confidence as follows:

$$C(t_{obs}, t_{OP})$$

As an example, as to a particle filter approach, consider weights being evaluated in a latent space as defined in a deep Kalman filter (DKF) (see also FIGS. 12 and 13):

$$X_{t+1} \leftarrow f(X_t) + b(U_{t-w:t})$$

$$Z_{t+1} \leftarrow h(X_{t+1})$$

In the foregoing equations, f, b (transfer) and h (measurement) are functions. As an example, a method can include using a neural network as a universal function approximator for the f, b, and h functions.

As an example, a particle with a maximum weight with respect to a location based on observations (e.g., measurements) can define a prescribed action in an OP where the OP includes multiple actions and, for example, the posterior of particles can define confidence of tracking. As an example, consider a mapped $t_{OP}$ and confidence being calculated as follows:

$$t_{OP} = \arg\max_i(P_i)$$

$$\mathrm{Conf} = \max(P_i)$$

Figure 8:
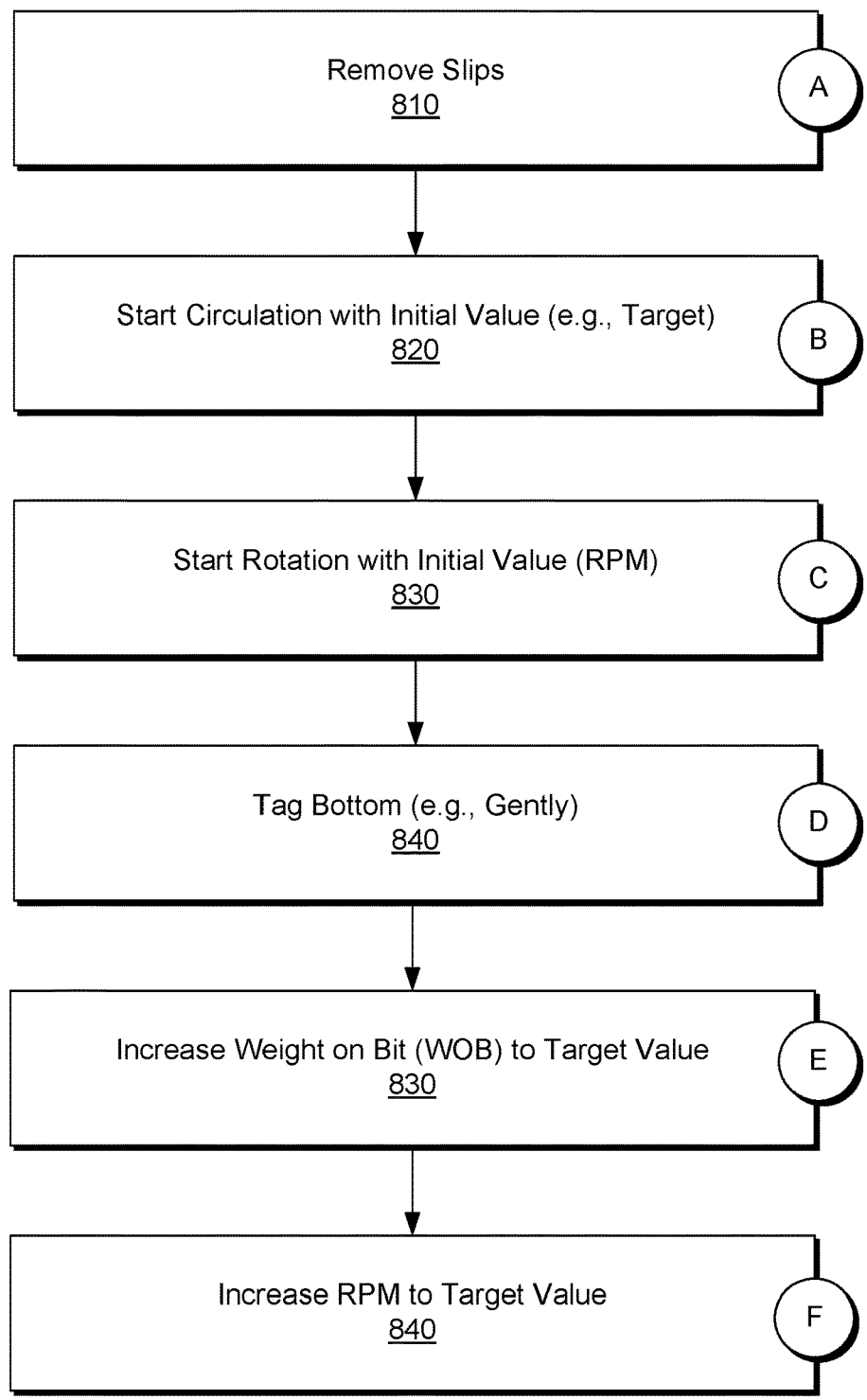
FIG. 8 illustrates an example of a method as an operational procedure.

FIG. 8 shows an example of an operational procedure (OP) 800 that includes a removal block 810 for removing slips, a start block 820 for starting circulation (e.g., to a target or to reach a target), a start block 830 for starting rotation of a drillstring with an initial value (e.g., initial RPM of approximately 70 RPM), a tag block 840 for tagging a bottom of a hole (e.g., gently), an increase block 850 for increasing a weight on a bit of the drillstring and an increase block 860 for increasing rotation of the drillstring to a target value (e.g., a target RPM value). As shown, each of the blocks may be represented with a symbol such as a character (e.g., A, B, C, D, E, and F).

Figure 9:
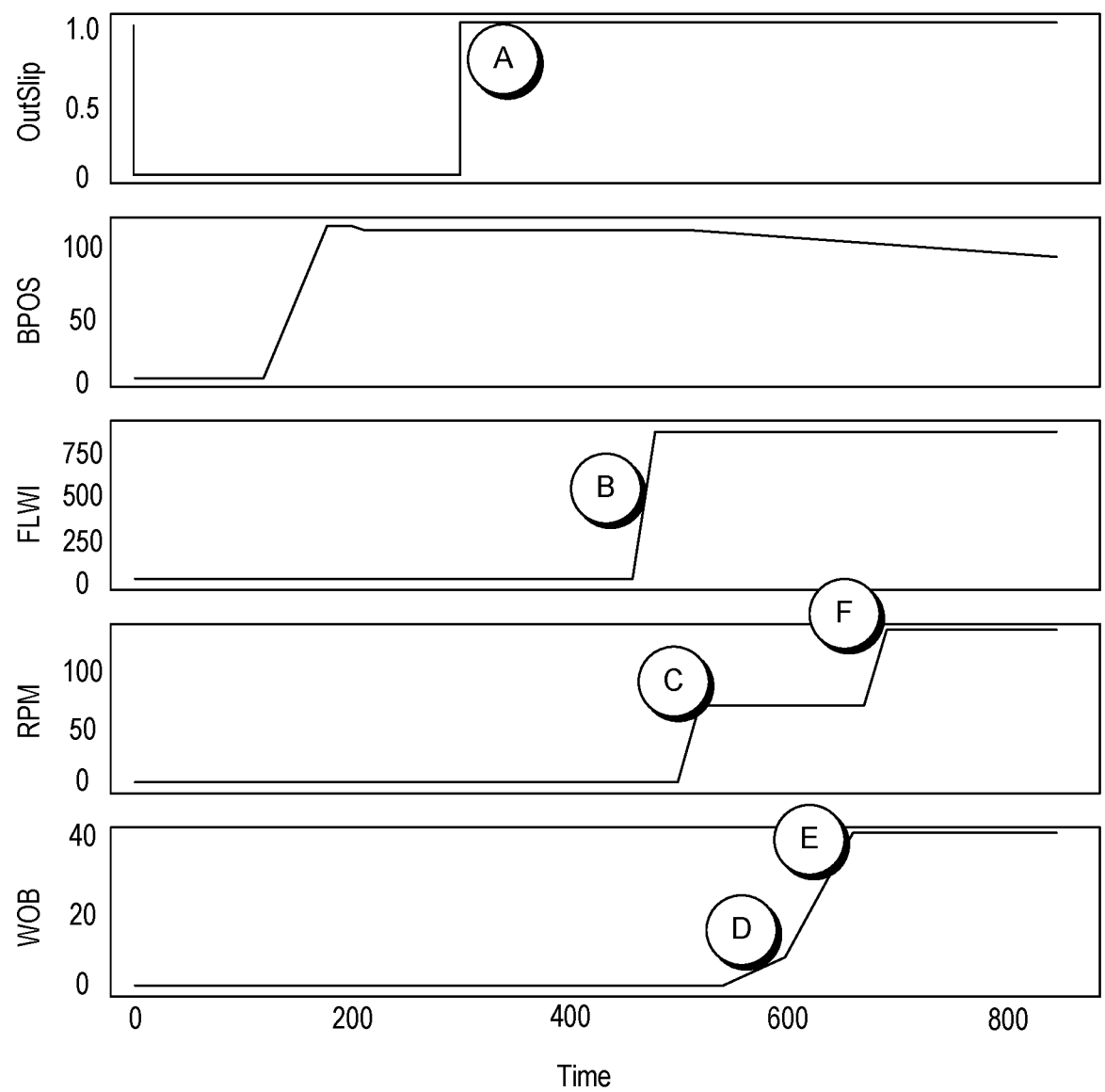
FIG. 9 illustrates an example of a plot with reference to the operational procedure of FIG. 8.

FIG. 9 shows examples of time series data rendered with respect to time 900 where the time series data include outslip data, BPOS data, FLWI data, RPM data, and WOB data. As shown, the actions of the method 800 can be identified according to patterns in the rendered data. For example, A represents a transition to out of slips, B represents a transition in flow rate, C represents a transition to an initial rotational speed of a drillstring, D represents a transition to weight on bit of the drillstring, E represents a further increase in weight on bit of the drillstring and F represents a further increase in rotational speed of the drillstring. Accordingly, the operational procedure 800 may map to a multi-channel data space where patterns can be formed with respect to data versus time that can be utilized to identify the actions of the operational procedure 800.

As an example, for a given dynamic system, it can be desirable to know the state of the system at a particular point in time or points in time. The state of such a system can be relatively complex, as it can be dependent on various variables, which can define a state space (e.g., a multi-dimensional state space). As an example, for a dynamic system, at least some sensor data can be acquired using one or more sensors, which can be operatively coupled to the dynamic system, part of the dynamic system, etc. However, the ability to identify the state of the dynamic system from such sensor data can be, mathematically, underdetermined. In other words, the sensor data alone may or may not allow for proper state identification of the dynamic system at a particular point in time. Where one or more relationships exist, which may be approximate themselves, such one or more relationships can help to identify a dynamic system state given the available sensor data; noting that such sensor data may be clean, noisy, include gaps, etc. In particular, different sensors may provide data of different quality. For example, a position sensor for block position of a traveling block may be relatively high quality; however, load, weight, etc., sensor data may be of lesser quality, for example, consider interactions of a drillstring with its downhole environment that may affect surface and/or downhole sensor data as to load, weight, etc. As may be appreciated, uncertainties can exist in sensor data, which may be quantifiable to some degree (e.g., consider a cone of uncertainty approach that may be with respect to depth, etc., such that uncertainty of certain sensor data may increase as depth of a drillstring increases, etc.).

As an example, a particle filter can help to identify a state of a dynamic system given one or more observations, which can be sensor data (e.g., sensor measurements, etc.). As an example, a particle filter can be utilized to locate a time window of multi-channel sensor data for a dynamic system where the time window is defined to be a particle.

As an example, a dynamic system can be characterized by its states in a state space, which may be considered a map. As an example, a state space can include bounds. In a localization problem for a mobile device (e.g., a robot, an airplane, etc.), a state space can be a map, which may be 1D, 2D or 3D and include physical boundaries that the mobile device cannot cross, penetrate, etc. For example, consider a wall, the surface of the Earth, etc., as some types of boundaries.

As to an airplane example, consider a map as being known to some extent where observables include elevation of the airplane with respect to sea level and distance of the airplane with respect to the ground below it (e.g., which may vary spatially in the map). To implement a particle filter, a number of hypotheses may be considered such as 200 hypotheses as to location of the airplane, where such hypotheses can be distributed across the map. For example, these hypotheses can be randomly generated and plotted as points, which can be deemed to be particles (e.g., each particle being a possible location of the airplane within the map). Next, consider the observables for the airplane at a given point in time as being elevation and distance to ground. Given such observables and particles on the map, each of the particles can be evaluated with respect to its probability of being the actual location of the airplane (e.g., the state of the dynamic system, which is the airplane, assuming the map does not change with respect to time). The evaluation process can assign a weight to each of the particles (e.g., hypothetical positions or states) where, for example, the more probable (e.g., the higher the probability) that the airplane is at the hypothetical location, which is the particle in state space, the greater the weight assigned to that particle. Stated otherwise, a particle that does not "explain" the observations (e.g., sensor data) concerning the location of the airplane is assigned a lower weight.

The foregoing particle filter process, at its initial step, generates weights for an initial set of particles. As some of those particles are unlikely to explain the observations, they can be discounted or otherwise disregarded via a process referred to as resampling. Resampling can generate a new set of hypotheses (e.g., particles) that is "informed" by the prior set. For example, the new set of particles can be generated to be located in the state space at or proximate to high probability particles and the new set of particles may be generated to be of equal probability before assessment (e.g., equal initial weight).

As the airplane is a dynamic system, its position is not constant (e.g., it is not a helicopter that can remain stationary in the sky). The resampled particles can be assigned information as to changes in position of the airplane, for example, consider assigning each of the particles a velocity (e.g., speed). The resampled particles can then be shifted in the state space (e.g., map space) In other words, the particles can be propagated in time based on a characteristic of the airplane, which can be considered a model of the airplane (e.g., the airplane moves in space at a velocity). In such an example, where a range of speeds is considered, the weights of the resampled and propagated particles can be updated to reflect how likely the speed is the actual (e.g., real) speed of the airplane. Next, the particles are assessed with respect to the observables (e.g., elevation and distance to ground) and assigned appropriate weights.

As may be appreciated, resampling can occur again where the assigned weights can be utilized as a basis to disregard some particles while generating a new set of particles. Further, as new observables are available in time, they can be utilized in the weight assignment process; noting that the airplane is moving in space according to some model (e.g., velocity in space).

As an example, a particle filter for a mobile device can plot particles after each resampling, which can correspond to increments in time for the mobile device and its location in space. Such a particle filter can vary in its ability to locate the mobile device, for example, consider a scenario where the observables provide "less" information. Less information in the context of the airplane can be where distance to ground remains constant for some period of time (e.g., flying over a flat surface such as that of an ocean rather than hill terrain). The foregoing process for the airplane included providing a map, updating weights according to observables (e.g., testing hypotheses), resampling with respect to the weights, and propagating the particles in time using a model (e.g., speed of airplane moving the airplane a distance with respect to the map for a given increment of time).

Figure 10:
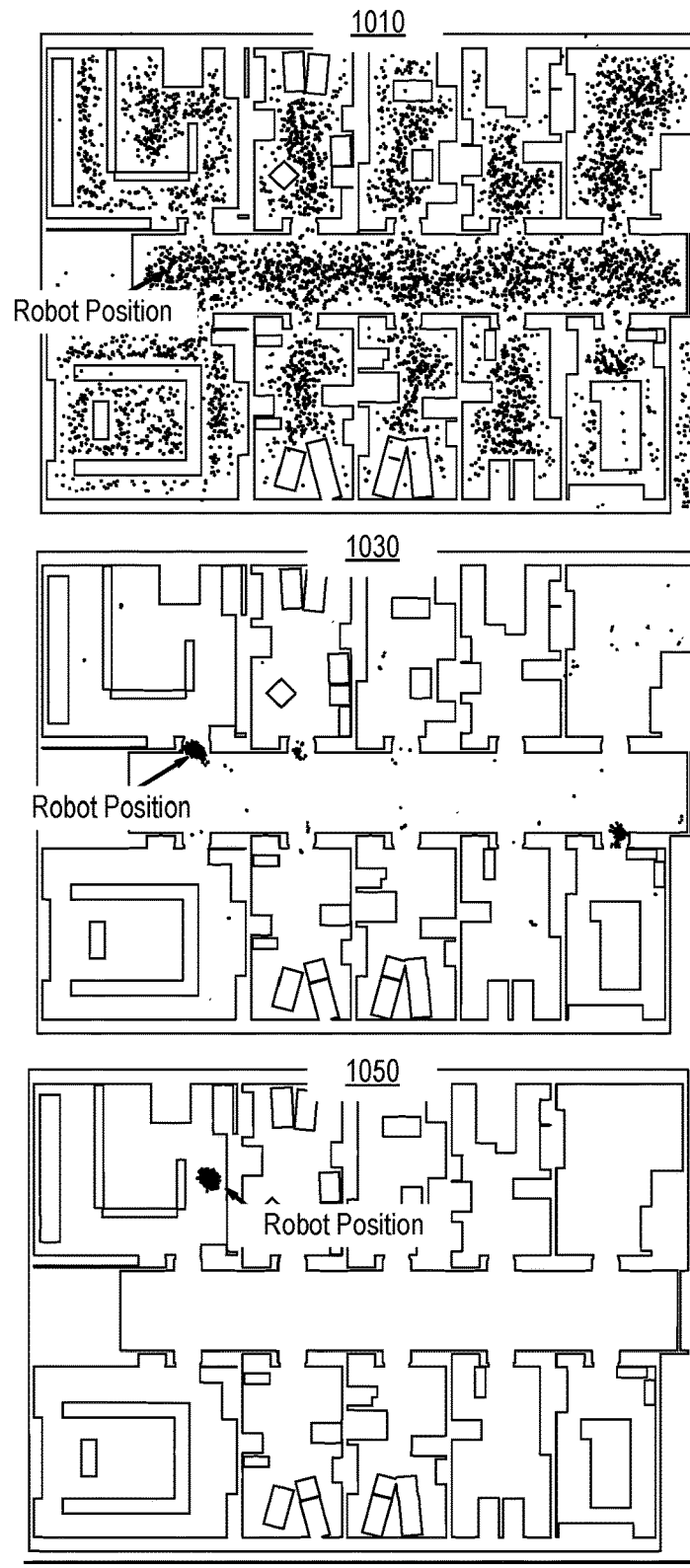
FIG. 10 illustrates an example of a particle filter.

FIG. 10 shows various examples of particle filter graphics 1010, 1030 and 1050 with respect to a problem that involves a two-dimensional space and a device within that two-dimensional space that can be described by a higher number of dimensions. For example, consider a robotic device that is mobile and with a rotational axis such that a pose can be defined as an x,y location in the two-dimensional space along with an angle of rotation about the rotational axis.

The particle filter can be a Monte Carlo localization (MCL), a particle filter algorithm for mobile robot localization where the graphic 1010 represents global uncertainty, the graphic 1030 represents approximately bimodal uncertainty after navigating in a (symmetric) corridor, and the graphic 1050 represents unimodal uncertainty after entering a uniquely-looking office.

Particle filters can be considered as approximate techniques for calculating posteriors in partially observable controllable Markov chains with discrete time. Suppose the state of the Markov chain at time t is given by xt where the state xt depends on a prior state xt−1 according to a probabilistic definition, which may be as follows:

$$p(xt|ut, xt-1)$$

where ut is a control assumption asserted in the time interval (t−1;t].

The state in such a Markov chain may be unobservable (e.g., hidden) where zt is measurable, which can be a stochastic projection of the true state xt generated via a probabilistic definition, which may be as follows:

$$p(zt|xt)$$

As an example, an initial state x0 can be distributed according to a distribution p(x0). For a mobile robot, the foregoing equations can be deemed an actuation or motion model and a measurement model, respectively.

As an example, a particle filter can be applied in a continuous state space. As an example, in certain conditions, a particle filter can be equivalent to a Kalman filter. For example, if p(x0) is Gaussian and the model(s) are linear in their arguments with added independent Gaussian noise. Where behavior is considered non-linear, linearization may be utilized, for example, using a first-order Taylor series expansion, for example, as in an extended Kalman filter (EKF).

Particle filters can address instances of nearly unconstrained Markov chains. For example, a particle filter approach can approximate the posterior of a set of sample states {xt[i]}, which can be referred to as "particles". For example, in a state space, each of the sample states can be a point. In such an example, each sample state can be a concrete state sample denoted by the index i, where i may range from 1 to M, which is the size of the particle filter.

As an example, a particle filter can be defined via initialization and recursion. For example, initialization can involve at a time that is an initial time, drawing M particles according to p(x0) and referring to those particles as a set of particles X0. As to recursion, for a time greater than the initial time, a process can generate a particle that is a sample particle for each particle of a prior time that is within the set of particles Xt−1 where such an approach draws from an actuation model. In such an approach the resulting set of particles can be referred to as Xt-intermediate. That set can be utilized to draw M particles so that each particle xt[i] is within the set Xt-intermediate and drawn with replacement with a probability proportional to the measurement model defined as p(zt|xt[i]). That resulting set can be referred to as Xt. In such an approach, as the number of particles defined, which is the size of the particle filter M, tends to infinity, the recursive procedure leads to particle sets Xt that converge uniformly to a desired posterior p(xt|zt, ut), under some mild assumptions of the Markov chain. As an example, a particle filter approach can be applied without linearizing non-linear models.

As an example, a particle filter can be utilized with respect to an objective, which can be to estimate the posterior density of state variables given observation variables. For example, state variables may be "hidden"; whereas, observation variables can be measurable or otherwise "observable" (e.g., not hidden). As mentioned, a particle filter can be associated with a hidden Markov Model (HMM), where a system can be defined to include hidden variables (e.g., state variables) and observable variables (e.g., measurable variables). As an example, observable variables (e.g., as part of an observation process) can be related to the hidden variables (e.g., as part of a state-process) by some functional form, which may be known or, for example, discernable to some degree (e.g., knowable through training a neural network model, etc.). As an example, a dynamic system that can describe evolution of state variables can be defined to be known probabilistically.

As explained, a particle filter can be utilized to estimate the posterior distribution of hidden states using an observation measurement process. Consider a state-space shown below:

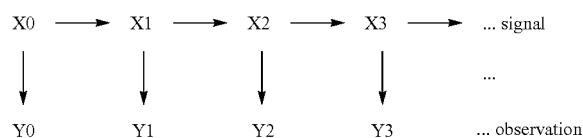

In the foregoing example, the filtering problem can be to estimate sequentially the values of the hidden states $X_k$, given the values of the observation process $Y_0, \ldots, Y_k$, at a time step k.

As an example, Bayesian estimates of $X_k$ can follow from the posterior density $p(x_k|y_0,y_1,\ldots,y_k)$. Such an approach provides an approximation of these conditional probabilities using the empirical measure associated with a genetic type particle algorithm.

Referring to FIG. 10, the graphics 1010, 1030 and 1050 illustrate particle filters in the context of global localization of a mobile device in a known environment. The graphics 1010, 1030 and 1050 represent a progression of three situations in which a number of particles approximate the posterior at different stages of device operation. Each particle is a sample of a three-dimensional pose variable (e.g., x,y location and angle), which can be defined relative to the map. The graphics 1010, 1030 and 1050 represent the development of particle filter approximation over time, from global uncertainty (1010) to a well-localized mobile device (1050).

As an example, tracking a dynamic system with respect to an OP (see, e.g., FIGS. 8 and 9) can be cast as a localization problem. A localization problem can involve the following components: a map; particles; a state transition model; observation; and weight update. Such an approach may be akin to the airplane example where the state transition model utilized included velocity of the airplane that moved the airplane a distance in space (e.g., with respect to the map) for an increment in time.

As mentioned, for a dynamic system with multi-channel measurements and an OP (e.g., or one or more other desired or desirable tracking metrics), tracking of location can be with respect to a window, which is a time window that can be specified via a model as including a velocity (e.g., how the time window moves with respect to an increment in time). In a particle filter approach, a particle with a maximum weight can define a particular action of an OP being executed (e.g., at a time $t_{OP}$).

As an example, a map can be simulated OP control signal instances and physical constraints. For example, consider the time series data rendered with respect to time 900 of FIG. 9, which include labels A, B, C, D, E and F, which correspond to various actions of the operational procedure 800 of FIG. 8.

Figure 11:
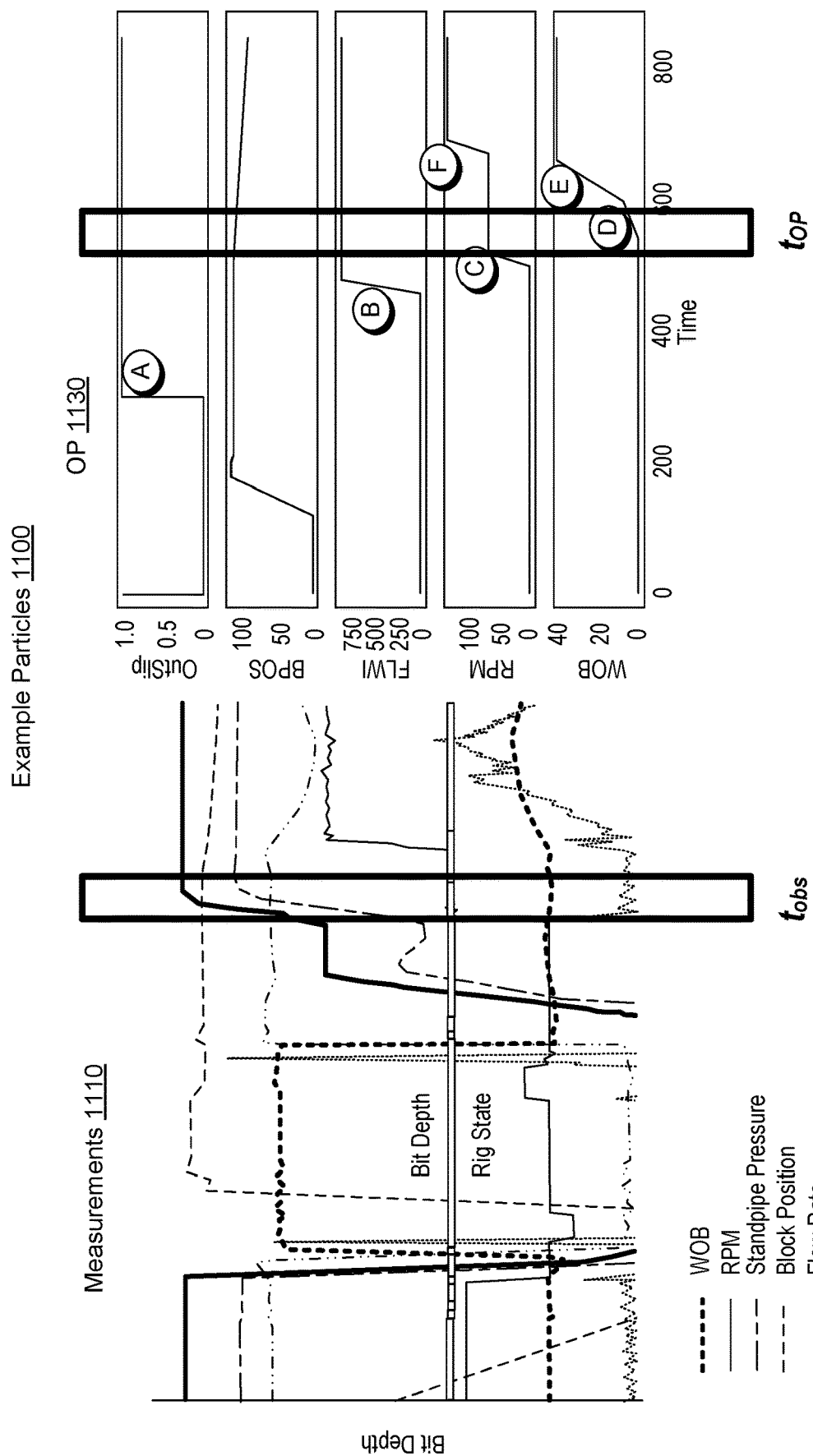
FIG. 11 illustrates examples of particles of a particle filter.

FIG. 11 shows an example of particles 1100 with respect to a plot of measurements 1110 and a plot of operational procedures 1130. As an example, particles can be a window location, a window moving velocity, and multi-channel signal in the window. In FIG. 11, in the plot 1110, a time window is labeled $t_{obs}$ with respect to various measurements that include weight on bit (WOB), rotational speed (RPM), standpipe pressure, block position, flow rate, surface torque, hookload and bit depth. Also shown is bit depth along with rig state, which are represented by various graphical segments with respect to bit depth and time where each of the discrete graphical segments represents a rig state. The time window $t_{obs}$ corresponds to a time window that has occurred in a time that is a past time, which was during drilling operations a real time. Specifically, the measurements are historical measurements as may be stored in a memory device, etc. The measurements in the plot 1110 may be those of an ongoing process, for example, where the right side of the plot 1110 shows measurements that are in real time. As to a time scale, the plot 1110 can be for a span of approximately 800 units in time such that it corresponds to the time scale of the plot 1130, which may be standardized for one or more operational procedures (see, e.g., FIG. 9). As shown in the plot 1130, the OP includes a time window identified as $t_{OP}$, which in the example of FIG. 11, corresponds to the measurements of the time window $t_{obs}$.

As an example, a method can include utilizing a particle filter technique for channels of data (e.g., measurements) to "locate" the channels of data temporally with respect to one or more operational procedures (e.g., OP(s)). As an example, a method can utilize a particle filter to track the temporal location of an observed drilling sequence with respect to an OP sequence. FIG. 11 shows such tracking where the observed sequence within the time window $t_{obs}$ is tracked with respect to the OP sequence within the time window $t_{OP}$.

As an example, during drilling operations, an approach as illustrated in FIG. 11 may be employed to make determinations as to whether one or more operational procedures have been followed. As an example, such an approach may, additionally or alternatively, track OP performance dynamically using measurements acquired during drilling operation(s). For example, consider the measurements being acquired and processed to track a time window with respect to a time window of one or more OPs. As an example, a method can include rendering a time window to a display dynamically with respect to one or more OP plots. Such a method may, for example, render measurements as a plot or plots and render one or more OP plots. As an example, a graphical user interface (GUI) can include plots such as the plots 1110 and 1130 of FIG. 11. As an example, a method can include tracking of a time window and rendering in a latent space (e.g., a feature space) or rendering in a space that is derived from a latent space (e.g., a feature space). In such an example, consider processing data from a latent space using a principal component analysis (PCA) or other technique.

As an example, a deep Kalman filter approach can be employed to estimate weights of particles. In such an approach, the most likely temporal location on an OP can be estimated with a corresponding confidence level (see, e.g., FIG. 14).

As to a model, which can be a state transition model, consider a window location being updated based on its moving velocity and a channel being updated based on a delta observed from an actual time series.

As to observations, consider actual multi-channel time series data as acquired by one or more sensors associated with a dynamic system (see, e.g., the plot 1110).

As to a weight update as to particle weights, as mentioned, a particle weight can represent a likelihood that a particle represents an actual state of a dynamic system at a given point in time.

Figure 12:
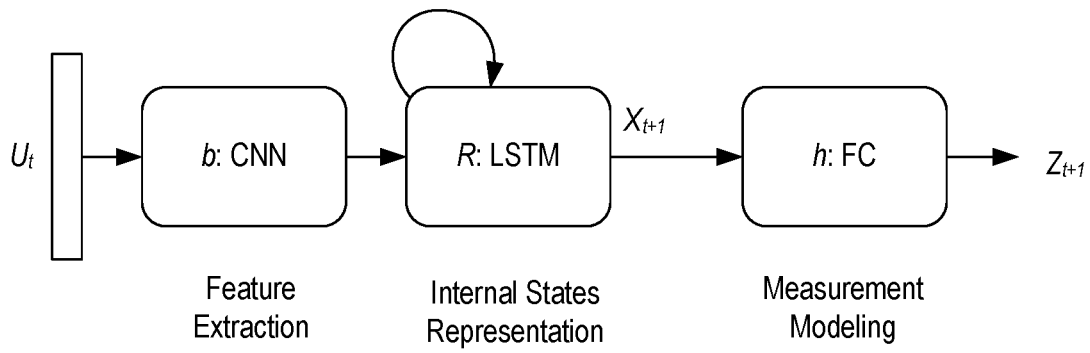
FIG. 12 illustrates an example of a neural network model that includes a deep Kalman filter (DKF)
Figure 13:
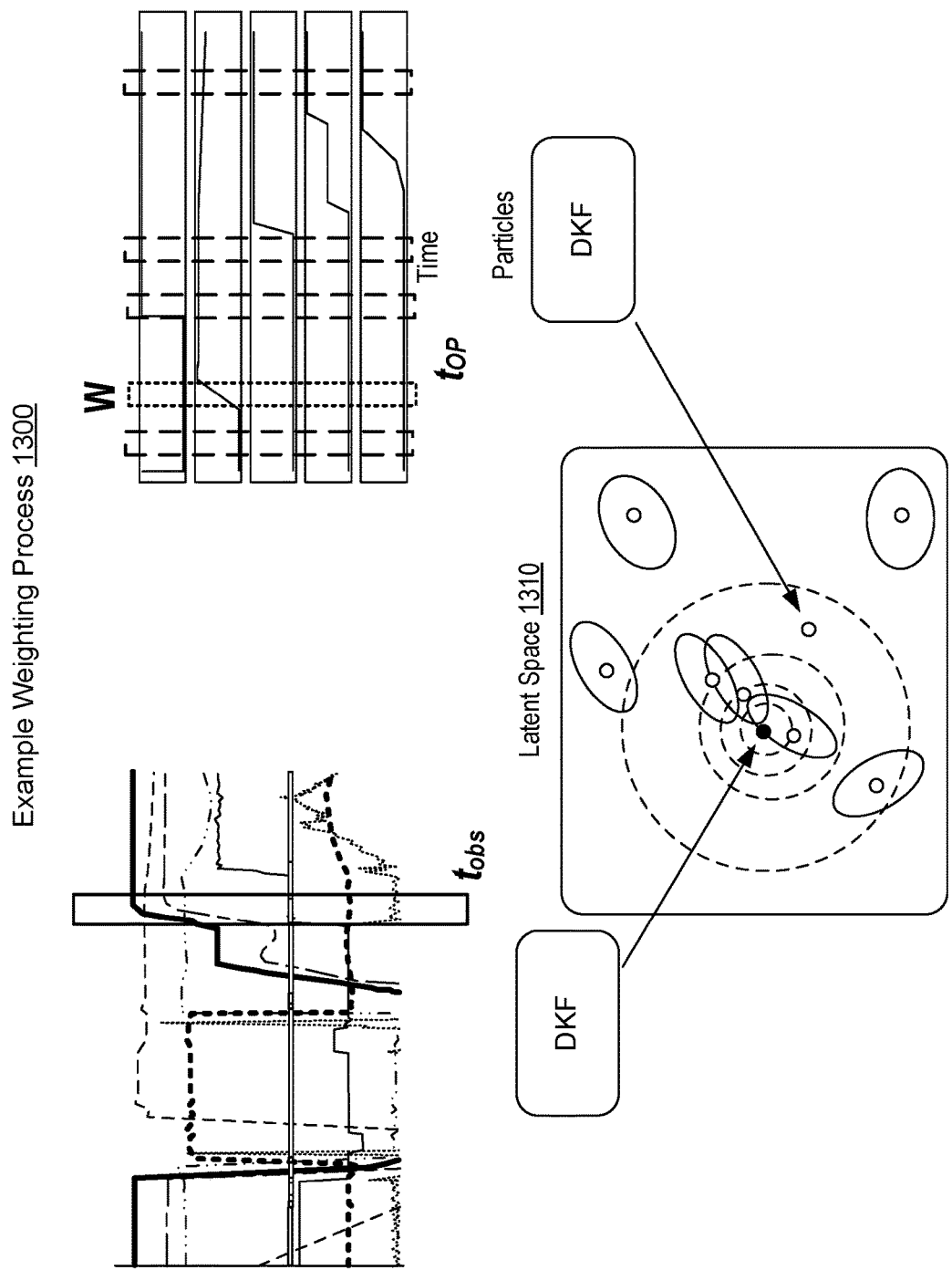
FIG. 13 illustrates an example of a weighting process that weights particles of a particle filter.

FIG. 12 shows an example of a neural network model of a deep Kalman filter 1200 that can be utilized for particle weight assignment (see, e.g., FIG. 13). In such an example, internal states of a dynamic system can be represented via a deep neural network within a latent space. For example, a convolution neural network (CNN) can perform feature extraction that is fed to one or more recurrently layers (e.g., long short-term memory (LSTM) layers, etc.) that can output an encoded representation of the internal state of the dynamic system in a latent space (e.g., feature space). Where the neural network considers the dynamic system cast in terms of a deep Kalman filter, the functions b, h and R can be determined via training of the neural network utilizing actual time data (see, e.g., the plot 1110).

As an example, a particle can be compared to an internal state in a latent space for purposes of assigning a weight to the particle. As indicated in FIG. 12, particle weights can be evaluated in the latent space defined in a deep Kalman filter.

In the example of FIG. 12, input can be multi-channel measurements such as, for example, measurements that can include one or more of the measurements shown in the plot 1110 of FIG. 11, etc. Such measurements can be time-windowed and represented as a vector or other data structure. In FIG. 12, the input is designated $U_t$ (e.g., time-windowed measurement input for a corresponding time t). In the example of FIG. 12, the input is subjected to feature extraction using a convolution neural network (CNN) with a trained function b. The output of the CNN is fed to one or more long short-term memory (LSTM) layers (e.g., as examples of one or more recurrent layers), for representation of internal states (e.g., in a latent space, which can be a feature space). The one or more LSTM layers can include one or more forget gate (fg) LSTM layers where values that correspond to temporal behavior(s) can be diminished (e.g., forgotten) and/or reset as may be appropriate to enhance handling of time series data as may be acquired during one or more drilling operations. The output of the one or more LSTM layers can be encoded in that it is reduced in its dimensionality with respect to the input to the CNN. For example, the LSTM output can be a n-dimensional vector that represents a state of a dynamic system where the dimension "n" is less than a dimension of the input to the CNN. The LSTM output is valuable for purposes of making comparisons, decisions, visualizations, etc., which may be utilized for adjusting one or more operations, controlling equipment, etc. As shown in FIG. 12, the LSTM output $X_{t+1}$ can be fed to one or more fully connected layers (FC), which can generate output $Z_{t+1}$, which can be, for example, response channels.

As an example, input to the CNN can include one or more of RPM, block position, slip status, flow rate, weight on bit, etc., and the output of the FC can include one or more of torque, rate of penetration (ROP), hookload, pressure, etc.

As an example, the neural network of FIG. 12 (e.g., CNN, recurrent layer(s), FC) can be trained using various time series data to generate a trained neural network that can be utilized to predict responses, which can include predictions from actual input and/or synthetic input.

Again, in the example of FIG. 12, the output of the one or more LSTM layers is shown as $X_{t+1}$, which can be encoded output in the form of a vector (e.g., an n-dimensional vector). As mentioned, the one or more LSTM layers can include one or more forget gate (fg) LSTM layers, where, for example, values as to behavior as in memory can be forgotten, which can include diminishing influence and/or resetting. Such an approach can facilitate modeling of time series data such as the time series data of the plot 1110 with respect to a latent space (e.g., a feature space representation).

In the example of FIG. 12, the one or more fully connected (FC) layers can receive output from the one or more LSTM layers (e.g., as a vector, etc.) and process such output to generate a model of the measurements $Z_{t+1}$ based on the input $U_t$. In the example of FIG. 12, the input $U_t$ can be a vector that includes time-windowed multiple channels of measurements (see, e.g., measurements of the plot 1110 of FIG. 11).

FIG. 13 the plots 1110 (left) and 1130 (right) with respect to the time window $t_{obs}$ in the plot 1110 as corresponding to measurements and with respect to particles as time windows in the plot 1130 that are weighted using a deep Kalman filter approach, which can be illustrated (in approximation) according to a latent space graphic 1310 in FIG. 13. Specifically, the graphic 1310 shows the location of the time window of the observed measurements with respect to locations of particles. As mentioned, a particle filter can be probabilistic in that weighting can be associated with probabilities of a location being a location that corresponds to one or more observations. In FIG. 13, the example latent space shows a particle location as from observations (filled circle) and particles as to an operational procedure (OP) (open circles) where some of the open circles are closer to the filled circle in the latent space (e.g., feature space). As an example, the particle with the maximum weight can define a corresponding action in the OP. As an example, the posterior of particles can define the confidence of tracking. As an example, a mapped $t_{OP}$ and confidence then can calculated. As an example, a method can include weighting of particles of a particle filter for multi-channel data (e.g., observations or measurements) of a dynamic system where particle weights are estimated in a latent space (e.g., feature space) of a neural network such as the neural network of FIG. 12. For example, a method can include particle weighting for particles of a particle filter in a latent space as may be part of one or more LSTM layers of a neural network. As an example, a method can include processing output of one or more LSTM layers to transform a latent space to another type of space for one or more purposes (e.g., weighting, comparison, tracking, visualization, etc.). For example, consider an approach that utilizes a principal component analysis with a number of components being utilized to define a space that is based on a latent space.

In the example of FIG. 13, a particle with the highest posterior probability can be selected as the particle that defines the tracked time location in an OP (see, e.g., the plots 1110 and 1130 of FIG. 11).

Figure 14:
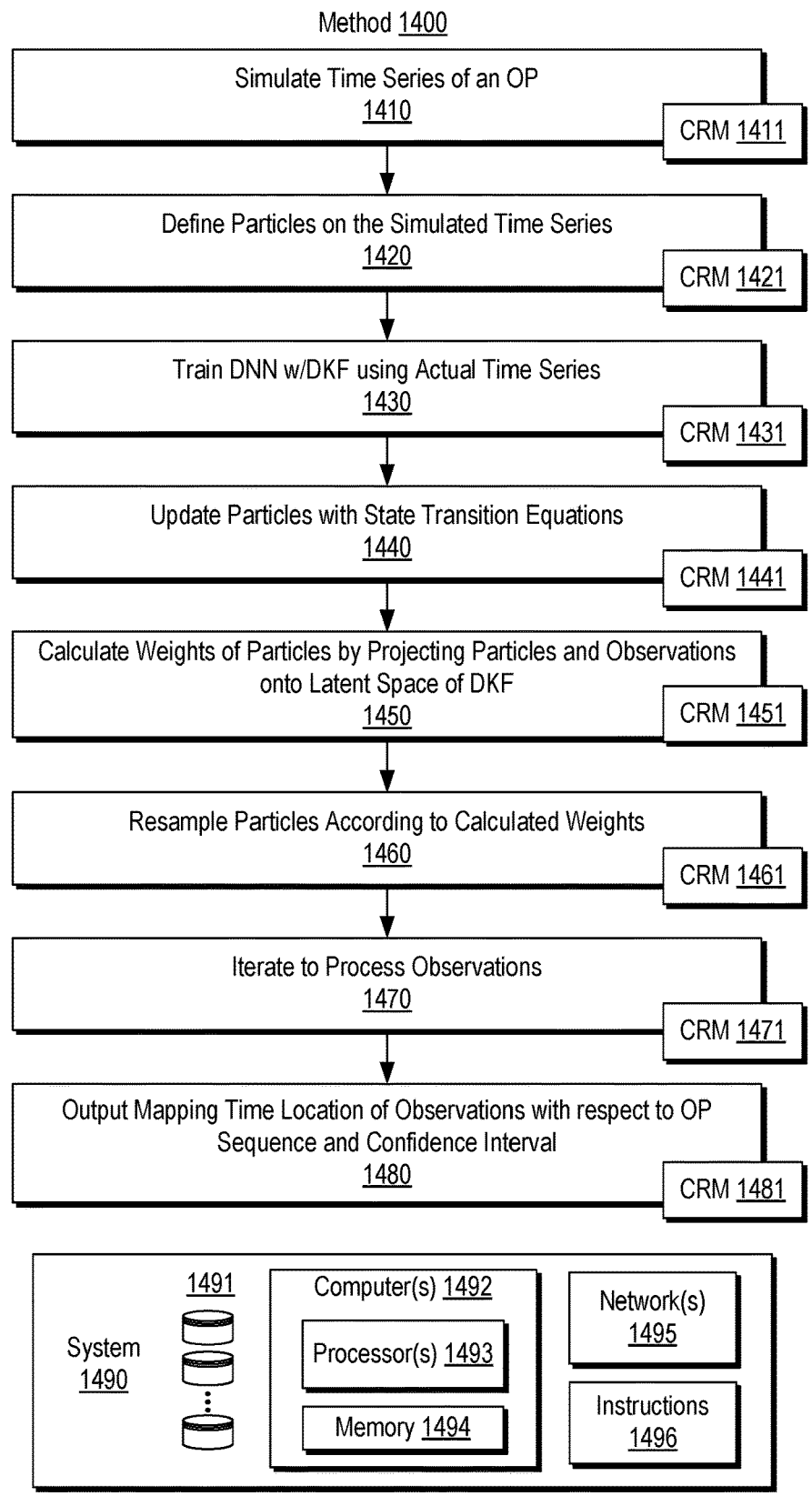
FIG. 14 illustrates an example of a method and an example of a system.

FIG. 14 shows an example of a method 1400 that includes a simulation block 1410 for simulating a time series of an OP (e.g., a description of proscribed actions to take with respect to a dynamic system); a definition block 1420 for defining particles on the simulated time series (see, e.g., the representation of the plot 1130 in FIG. 13); a training block 1430 for training a deep neural network (DNN) with a deep Kalman filter (DKF) using actual time series data (see, e.g., the plot 1110 of FIG. 11); an update block 1440 for updating particles with respect to state transition equations; a calculation block 1450 for calculating weights of particles by projecting the particles and observations onto a latent space of the deep Kalman filter (DKF) (see, e.g., the graphic 1310 of FIG. 13); a resample block 1460 for resampling particles according to calculated weights; an iteration block 1470 for iterating to process observations (e.g., measurements as from sensors of the dynamic system); and an output block 1480 for outputting mapping of time location(s) of observations with respect to the OP sequence along with one or more confidence intervals.

FIG. 14 also shows various computer-readable media (CRM) blocks 1411, 1421, 1431, 1441, 1451, 1461, 1471 and 1481 as associated with the blocks 1410, 1420, 1430, 1440, 1450, 1460, 1470 and 1480. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 14, a system 1490 includes one or more information storage devices 1491, one or more computers 1492, one or more networks 1495 and instructions 1496. As to the one or more computers 1492, each computer may include one or more processors (e.g., or processing cores) 1493 and memory 1494 for storing the instructions 1496, for example, executable by at least one of the one or more processors. As an example, a computer may include one or more network interfaces (e.g., wired or wireless), one or more graphics cards, a display interface (e.g., wired or wireless), etc. The system 1490 can be specially configured to perform the method 1400 of FIG. 14.

As an example, the iteration block 1470 can include repeating blocks 1440 to 1460 to process a desired number of observations. For example, consider a method that includes processing in real time such that observations are added when available from one or more drilling operations. As an example, the method 1400 can include processing observations from a database, which may be a historical database for one or more rigsites where one or more drilling operations have occurred. As an example, a computational framework can include one or more interfaces that are operatively coupled (e.g., directly and/or indirectly) to equipment, which can include rigsite equipment, databases, etc. In such an example, the computational framework can receive measurements (e.g., sensor data) and can process such measurements using one or more particle filters such that a time window of multi-channel measurements can be localized (e.g., with respect to one or more prescribed actions of an operational procedure, etc.). The localization, or tracking, as to measurements in time (e.g., within a time window) can generate results that can be utilized for one or more purposes to improve a dynamic system or dynamic systems, which can include control of equipment of a dynamic system or dynamic systems. As explained, where an operational procedure that specifies a sequence for a dynamic system is found to not have been followed, as determined by an assessment of measurements of the dynamic system that utilizes a particle filter, actions may be taken with respect to the dynamic system to improve an outcome (e.g., construction of a well, generation of fractures, production of a resource, etc.).

Figure 15:
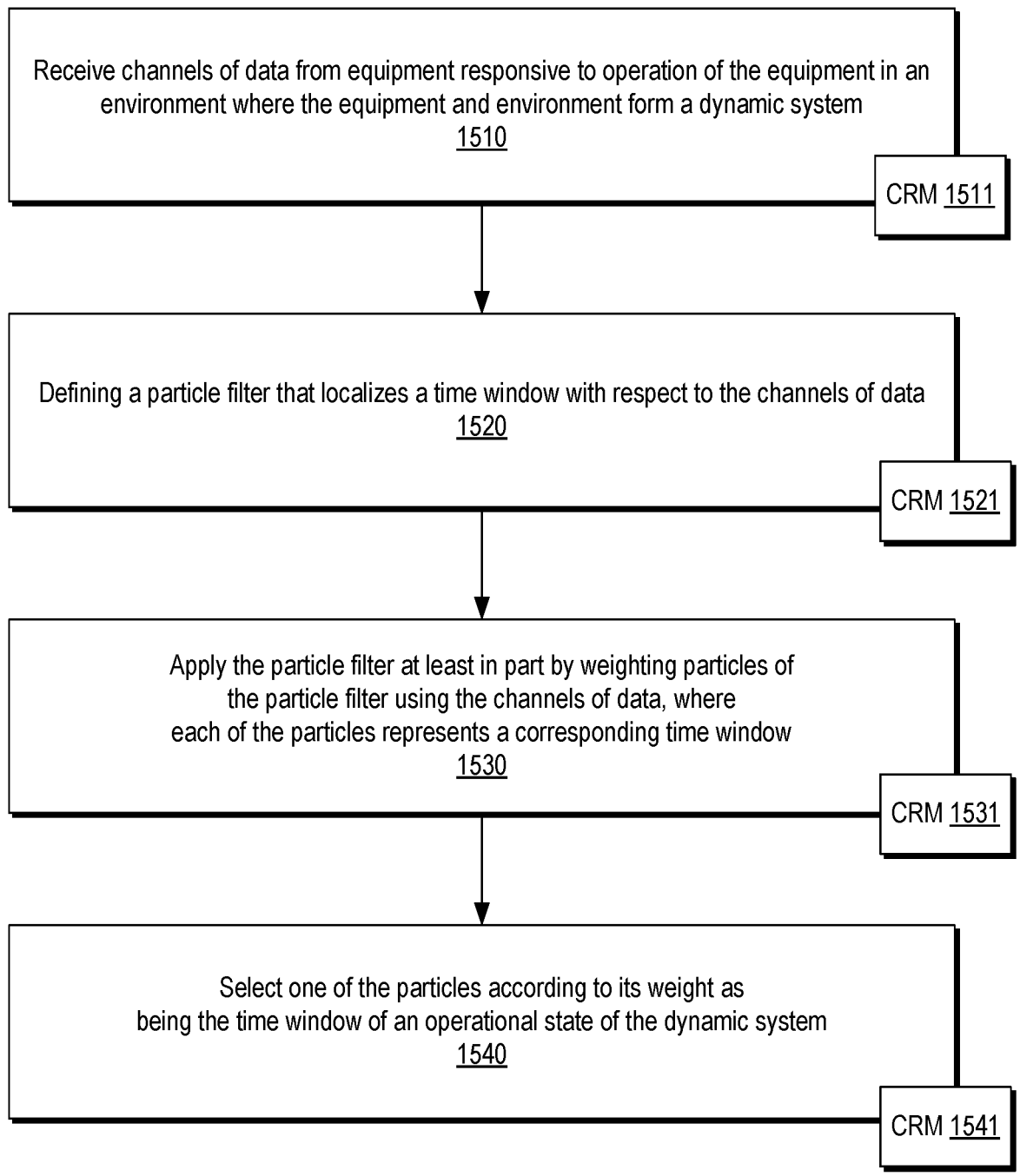
FIG. 15 illustrates an example of a method.

FIG. 15 shows an example of a method 1500 that includes a reception block 1510 for receiving channels of data from equipment responsive to operation of the equipment in an environment where the equipment and environment form a dynamic system; a definition block 1520 for defining a particle filter that localizes a time window with respect to the channels of data; an application block 1530 for applying the particle filter at least in part by weighting particles of the particle filter using the channels of data, where each of the particles represents a corresponding time window; and a selection block 1540 for selecting one of the particles according to its weight as being the time window of an operational state of the dynamic system.

FIG. 15 also shows various computer-readable media (CRM) blocks 1511, 1521, 1531 and 1541 as associated with the blocks 1510, 1520, 1530 and 1540. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format. The system 1490 of FIG. 14 can be specially configured to perform the method 1500 of FIG. 15.

As an example, a method can include utilizing a space for determining weights of particles where the space can be a space that can represent individual internal states of a dynamic system. For example, where the dynamic system includes equipment and an environment associated with drilling operations, the space can be a state space of the dynamic system (e.g., consider a rigstate space, etc.).

As an example, as to one or more operational procedures (OPs), a method can include making an assessment via localizing an operation using particle filter (e.g., operation recognition) and comparing a variance of the localization to a target operation, as may be, for example, defined or otherwise proscribed by one or more OPs; noting that an OP is an example of a type of action or sequence of actions that may be localized (e.g., recognized) in multi-channel time (e.g., time series sensor data) using a time window particle of a particle filter.

As mentioned, a deep Kalman filter can be utilized for weighting of particles of a particle filter. As to a Kalman filter itself, in comparison to a particle filter, a Kalman filter can be limited to selection of a single possibility (e.g., a single hypothesis) for a scenario such that an incorrect selection may be made. In such an example, the Kalman filter may be able to recover or not; whereas, a particle filter allows for tracking multiple hypotheses where introduction of additional data can result in shifting a best hypothesis (e.g., to a new location, etc.). A particle filter can handle scenarios that can be non-Gaussian and multi-modal and can provide an approximation of a state of a dynamic system. For example, a particle filter can utilize particles to represent a probability density function that can be non-Gaussian and multi-model where each particle represents a set of values of state variables such that each particle can be located in an appropriate state space. As mentioned, for a localization problem for a mobile device (e.g., a 2D robot or a 3D airplane), a state space can be a physical, spatial dimensional space. As explained, as to multi-channel data, a state space can be that of a dynamic system, which can be of more than two or three dimensions.

As an example, the neural network model 1200 of FIG. 12 can output an n-dimensional vector (e.g., via the one or more LSTM layers) that is in a latent space or feature space. As explained, particle weighting can be performed in such a space (e.g., or a space derived therefrom, etc.). As to an example, consider the n-dimensional vector having n greater than three (e.g., consider n being greater than 10, etc.). As may be appreciated, a dynamic system that includes a state space with a high dimensionality may be difficult to model using a physics model. As explained, such a dynamic system may be modeled using a neural network model that can be trained using actual time series (e.g., multi-channel) sensor data where such a trained neural network model can be utilized for one or more purposes (e.g., simulation, values of functions, etc.).

As explained, a dynamic system can be relatively complex and have relatively high dimensional state spaces. Such a dynamic system can have associated probability density functions, which can be non-Gaussian and multi-modal. As an example, a Kalman filter as a type of Bayes filter, generally utilizes a single Gaussian to represent the state of a dynamic system such that it can be constrained where input changes (e.g., hard to move away from the single Gaussian). As explained, a particle filter can be more flexible than a Kalman filter because it can maintain many hypotheses. For example, a particle filter can represent probability density functions that can be non-Gaussian and multi-modal such that it can be easier to move to a different region responsive to one or more changes, etc. As explained, a time window of measurements/observables in a dynamic system can be "localized" (e.g., recognized) using a particle filter (e.g., where the time window is a type of particle). As an example, localization can be with respect to an action such as an action within a proscribed sequence of actions such as an OP (e.g., consider an SOP). As an example, a method can include comparing locations of possible OP actions, where the possible OP actions are represented as particles in a state space (e.g., latent or feature space), to a location that corresponds to measurements/observables (e.g., as from a recurrent layer). Such a comparison may be utilized in determining weights of the particles as to whether they "explain" the measurements/observables as represented by a specific location in the state space. As an example, localization can be in a latent space/feature space of a neural network where such a neural network can include a deep Kalman filter and can model behavior of a dynamic system such as a rig system/environment.

As an example, a method can include receiving channels of data from equipment responsive to operation of the equipment in an environment where the equipment and environment form a dynamic system; defining a particle filter that localizes a time window with respect to the channels of data; applying the particle filter at least in part by weighting particles of the particle filter using the channels of data, wherein each of the particles represents a corresponding time window; and selecting one of the particles according to its weight as being the time window of an operational state of the dynamic system.

As an example, a method can include utilizing a particle filter that includes a map simulated from operational procedure (OP) control signal instances and physical constraints.

As an example, a method can include utilizing a particle filter where at least some particles are characterized by a time window velocity. For example, a particle can be a time window defined with respect to time series data associated with a dynamic system where the time window can be specified (e.g., modeled, etc.) using a time window velocity.

As an example, a method can include utilizing a particle filter that includes a state transition model that depends on a time window velocity and changes in received channels of data with respect to time.

As an example, a method can include weighting particles where such weighting includes using channels of data and a deep Kalman filter. As an example, weighting particles can be performed in a latent space defined in a deep Kalman filter. As an example, weighting particles can be performed in a state space for representing states of a dynamic system. As an example, weighting particles can utilize a space that includes a dimensionality that is greater than three. As an example, weighting can be with respect to a distance as may be calculated in a multidimensional space.

As an example, dimensionality can depend on dimensionality of output of one or more recurrent layers (e.g., long short-term memory (LSTM) layers, etc.) of a neural network model of the dynamic system.

As an example, a method can include utilizing a particle filter in a process that includes controlling a dynamic system based at least in part on an operational state where the operational state is determined, for example, via weighting of particles of the particle filter (e.g., consider selecting a particle with a highest weight, etc.).

As an example, an operational state can be a proscribed state of a pre-defined operational procedure.

As an example, a method can include outputting confidence of a selected one of a plurality of particles being an operational state.

As an example, a method can include receiving channels of data from equipment responsive to operation of the equipment in an environment where the equipment and environment form a dynamic system; defining a particle filter that localizes a time window with respect to the channels of data; applying the particle filter at least in part by weighting particles of the particle filter using the channels of data, wherein each of the particles represents a corresponding time window; and selecting one of the particles according to its weight as being the time window of an operational state of the dynamic system. In such an example, the equipment can include drilling equipment and/or can include sensors where the data are sensor data. As an example, channels of data can include at least two channels of data. As an example, channels of data can include block position data of a traveling block of a drilling rig (e.g., where a dynamic system includes drilling equipment).

As an example, a system can include a processor; memory accessible by the processor; processor-executable instructions stored in the memory and executable to instruct the system to: receive channels of data from equipment responsive to operation of the equipment in an environment where the equipment and environment form a dynamic system; define a particle filter that localizes a time window with respect to the channels of data; apply the particle filter at least in part by weighting particles of the particle filter using the channels of data, where each of the particles represents a corresponding time window; and select one of the particles according to its weight as being the time window of an operational state of the dynamic system. In such an example, the system can include processor-executable instructions stored in the memory and executable to instruct the system to control at least one piece of equipment of the dynamic system based on the operational state.

As an example, one or more computer-readable storage media can include processor-executable instructions to instruct a computing system to: receive channels of data from equipment responsive to operation of the equipment in an environment wherein the equipment and environment form a dynamic system; define a particle filter that localizes a time window with respect to the channels of data; apply the particle filter at least in part by weighting particles of the particle filter using the channels of data, wherein each of the particles represents a corresponding time window; and select one of the particles according to its weight as being the time window of an operational state of the dynamic system. In such an example, the processor-executable instructions stored in the memory and executable to instruct the computing system can include instructions to control at least one piece of equipment of the dynamic system based on the operational state.

As an example, a method may be implemented in part using computer-readable media (CRM), for example, as a module, a block, etc. that include information such as instructions suitable for execution by one or more processors (or processor cores) to instruct a computing device or system to perform one or more actions. As an example, a single medium may be configured with instructions to allow for, at least in part, performance of various actions of a method. As an example, a computer-readable medium (CRM) may be a computer-readable storage medium (e.g., a non-transitory medium) that is not a carrier wave.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 16:
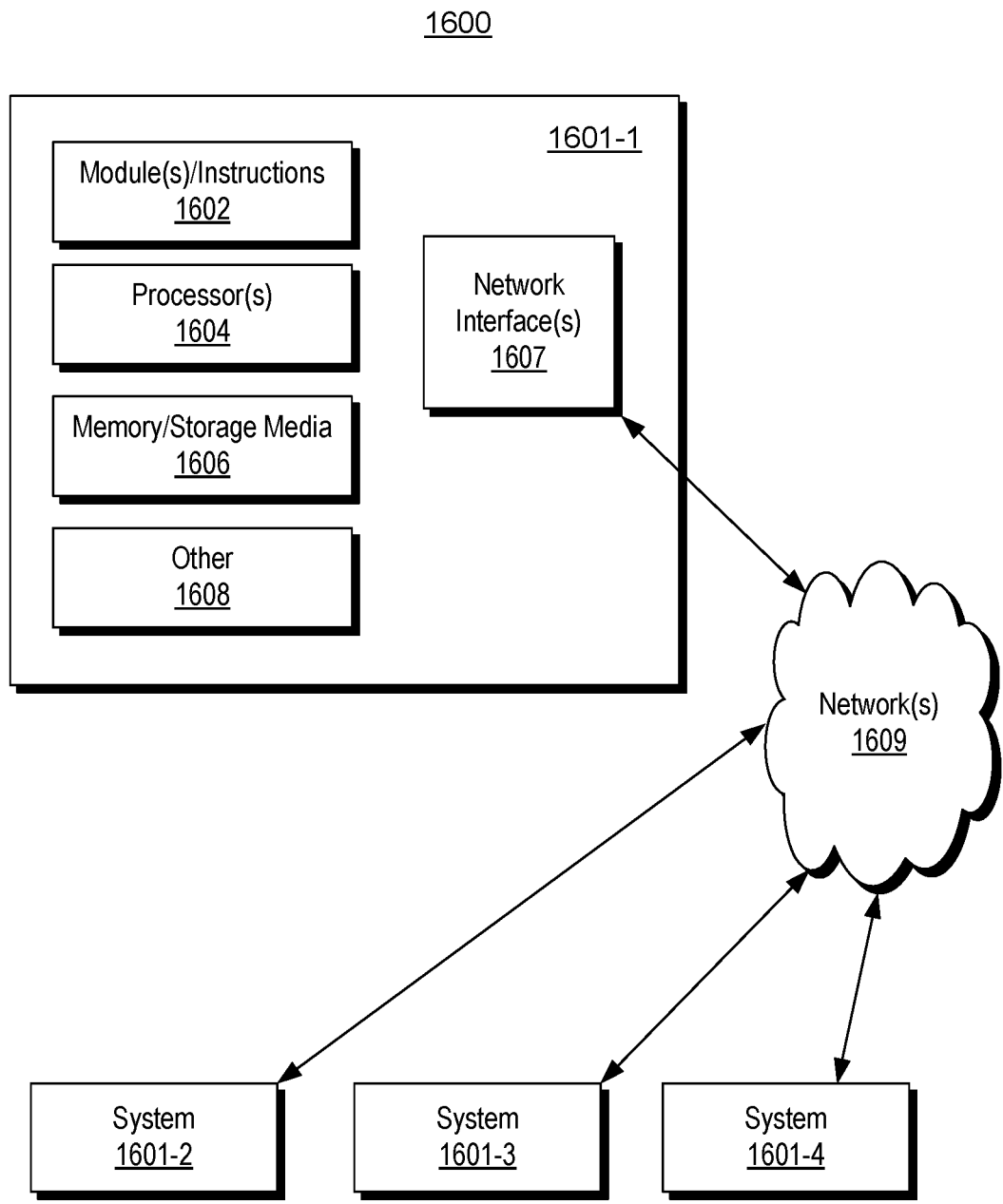
FIG. 16 illustrates an example of computing system.

In some embodiments, a method or methods may be executed by a computing system. FIG. 16 shows an example of a system 1600 that can include one or more computing systems 1601-1, 1601-2, 1601-3 and 1601-4, which may be operatively coupled via one or more networks 1609, which may include wired and/or wireless networks.

As an example, a system can include an individual computer system or an arrangement of distributed computer systems. In the example of FIG. 16, the computer system 1601-1 can include one or more modules 1602, which may be or include processor-executable instructions, for example, executable to perform various tasks (e.g., receiving information, requesting information, processing information, simulation, outputting information, etc.).

As an example, a module may be executed independently, or in coordination with, one or more processors 1604, which is (or are) operatively coupled to one or more storage media 1606 (e.g., via wire, wirelessly, etc.). As an example, one or more of the one or more processors 1604 can be operatively coupled to at least one of one or more network interface 1607. In such an example, the computer system 1601-1 can transmit and/or receive information, for example, via the one or more networks 1609 (e.g., consider one or more of the Internet, a private network, a cellular network, a satellite network, etc.).

As an example, the computer system 1601-1 may receive from and/or transmit information to one or more other devices, which may be or include, for example, one or more of the computer systems 1601-2, etc. A device may be located in a physical location that differs from that of the computer system 1601-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 1606 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 17:
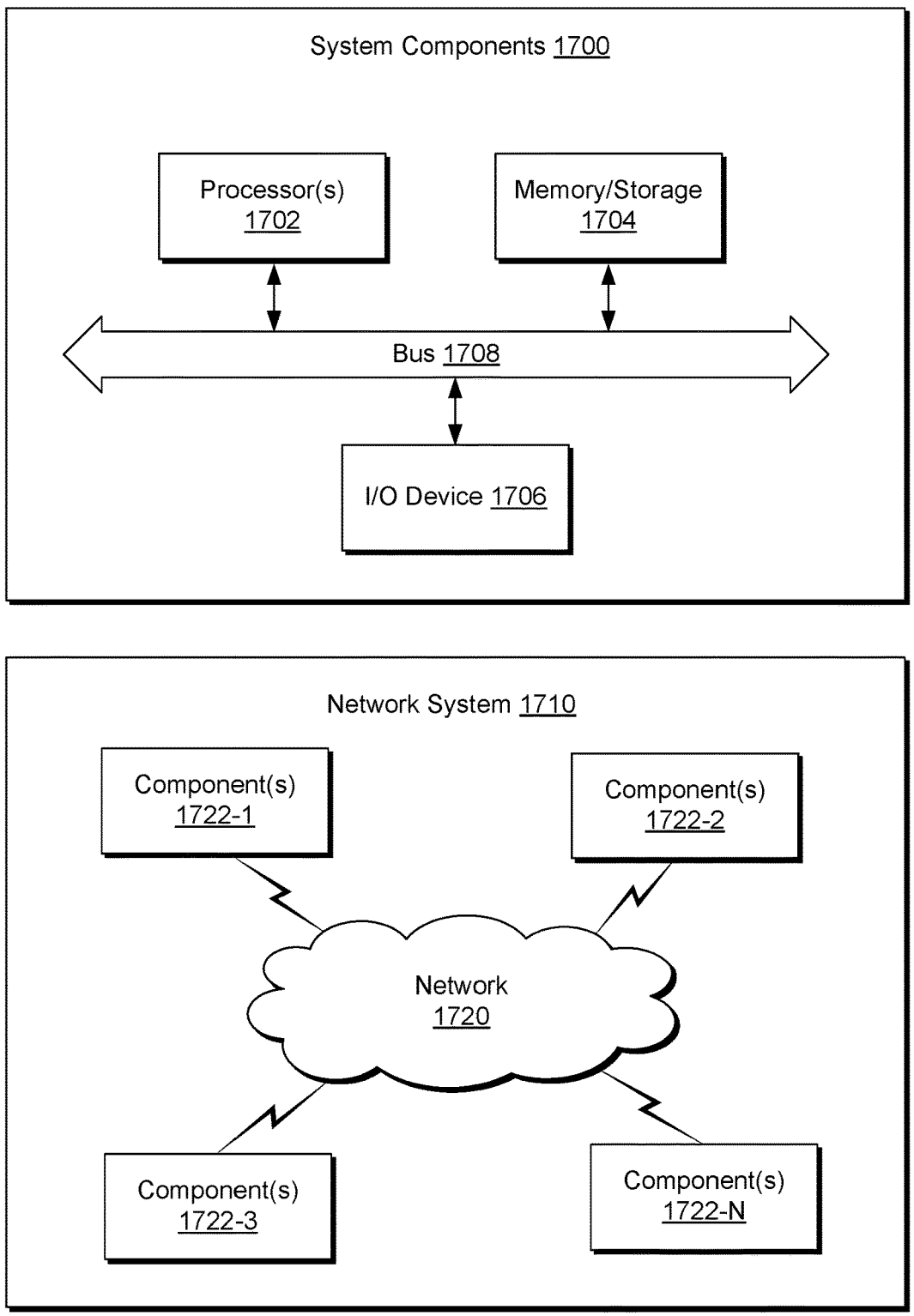
FIG. 17 illustrates example components of a system and a networked system.

FIG. 17 shows components of a computing system 1700 and a networked system 1710. The system 1700 includes one or more processors 1702, memory and/or storage components 1704, one or more input and/or output devices 1706 and a bus 1708. According to an embodiment, instructions may be stored in one or more computer-readable media (e.g., memory/storage components 1704). Such instructions may be read by one or more processors (e.g., the processor(s) 1702) via a communication bus (e.g., the bus 1708), which may be wired or wireless. The one or more processors may execute such instructions to implement (wholly or in part) one or more attributes (e.g., as part of a method). A user may view output from and interact with a process via an I/O device (e.g., the device 1706). According to an embodiment, a computer-readable medium may be a storage component such as a physical memory storage device, for example, a chip, a chip on a package, a memory card, etc.

According to an embodiment, components may be distributed, such as in the network system 1710. The network system 1710 includes components 1722-1, 1722-2, 1722-3, . . . 1722-N. For example, the components 1722-1 may include the processor(s) 1702 while the component(s) 1722-3 may include memory accessible by the processor(s) 1702. Further, the component(s) 1722-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   receiving channels of data from equipment responsive to operation of the equipment in an environment wherein the equipment and environment form a dynamic system;
   defining a particle filter that localizes a time window with respect to the channels of data;
   applying the particle filter at least in part by weighting particles of the particle filter using the channels of data, wherein each of the particles represents a corresponding time window;
   selecting one of the particles according to its weight as being the time window of an operational state of the dynamic system; and
   controlling the dynamic system based at least in part on the operational state.

2. The method of claim 1, wherein the particle filter comprises a map simulated from operational procedure (OP) control signal instances and physical constraints.

3. The method of claim 1, wherein the particles are characterized by a time window velocity.

4. The method of claim 1, wherein the particle filter comprises a state transition model that depends on a time window velocity and changes in received channels of data with respect to time.

5. The method of claim 1, wherein the weighting particles comprises using the channels of data and a deep Kalman filter.

6. The method of claim 5, wherein the weighting particles is performed in a latent space defined in the deep Kalman filter.

7. The method of claim 1, wherein the weighting particles is performed in a state space for representing states of the dynamic system.

8. The method of claim 1, wherein the weighting particles utilizes a space that comprises a dimensionality that is greater than three.

9. The method of claim 8, wherein the dimensionality depends on dimensionality of output of one or more recurrent layers of a neural network model of the dynamic system.

10. The method of claim 1, wherein the operational state is a proscribed state of a pre-defined operational procedure.

11. The method of claim 1, comprising outputting confidence of the selected one of the particles being the operational state.

12. The method of claim 1, wherein the equipment comprises drilling equipment.

13. The method of claim 1, wherein the equipment comprises sensors wherein the data are sensor data.

14. The method of claim 1, wherein the channels of data comprise at least two channels of data.

15. The method of claim 14, wherein the channels of data comprise block position data of a traveling block of a drilling rig.

16. A system comprising:
a processor;
memory accessible by the processor;
processor-executable instructions stored in the memory and executable to instruct the system to:
receive channels of data from equipment responsive to operation of the equipment in an environment wherein the equipment and environment form a dynamic system;
define a particle filter that localizes a time window with respect to the channels of data;
apply the particle filter at least in part by weighting particles of the particle filter using the channels of data, wherein each of the particles represents a corresponding time window;
select one of the particles according to its weight as being the time window of an operational state of the dynamic system; and
control at least one piece of equipment of the dynamic system based on the operational state.

17. One or more computer-readable storage media comprising processor-executable instructions to instruct a computing system to:
receive channels of data from equipment responsive to operation of the equipment in an environment wherein the equipment and environment form a dynamic system;
define a particle filter that localizes a time window with respect to the channels of data;
apply the particle filter at least in part by weighting particles of the particle filter using the channels of data, wherein each of the particles represents a corresponding time window;
select one of the particles according to its weight as being the time window of an operational state of the dynamic system; and
control at least one piece of equipment of the dynamic system based on the operational state.

* * * * *